(12) United States Patent
Amano et al.

(10) Patent No.: US 8,153,954 B2
(45) Date of Patent: Apr. 10, 2012

(54) PHOTOELECTRIC CONVERSION DEVICE AND ELECTRONIC DEVICE HAVING THE SAME

(75) Inventors: Seiko Amano, Kanagawa (JP); Hiroyuki Miyake, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 368 days.

(21) Appl. No.: 12/512,280

(22) Filed: Jul. 30, 2009

(65) Prior Publication Data

US 2010/0035661 A1 Feb. 11, 2010

(30) Foreign Application Priority Data

Aug. 8, 2008 (JP) ................. 2008-204965

(51) Int. Cl.
*H01J 40/14* (2006.01)
(52) U.S. Cl. ........... 250/214 R; 250/214 A; 250/214 DC
(58) Field of Classification Search ............. 250/214 R, 250/214 A, 214 LA, 214 LS, 214 AG, 214 C, 250/214 DC, 551; 455/550.1, 127.2, 127.3, 455/566; 136/243; 453/4; 340/870.29; 377/53; 330/59, 110, 308, 260; 341/31
See application file for complete search history.

(56) References Cited

U.S. PATENT DOCUMENTS

| | | | | |
|---|---|---|---|---|
| 4,188,551 A | * | 2/1980 | Iwasaki et al. | 396/228 |
| 4,363,541 A | * | 12/1982 | Aihara et al. | 396/253 |
| 4,523,101 A | * | 6/1985 | Tsunekawa | 250/208.2 |
| 4,673,807 A | * | 6/1987 | Kobayashi et al. | 250/214 AG |
| 4,731,529 A | * | 3/1988 | Ohsawa | 250/214 A |
| 4,739,459 A | * | 4/1988 | Kobayashi et al. | 362/307 |
| 4,789,777 A | * | 12/1988 | Takami et al. | 250/214 A |
| 4,831,450 A | | 5/1989 | Sato et al. | |
| 4,924,081 A | * | 5/1990 | Arima et al. | 250/214 R |
| 5,214,274 A | | 5/1993 | Yang | |
| 5,268,309 A | * | 12/1993 | Mizutani et al. | 438/59 |
| 5,373,152 A | * | 12/1994 | Domon et al. | 250/214 AG |

(Continued)

FOREIGN PATENT DOCUMENTS

EP 1 619 509 A1 1/2006

(Continued)

OTHER PUBLICATIONS

International Search Report (Application No. PCT/JP2009/063717) dated Nov. 10, 2009.

(Continued)

*Primary Examiner* — Dominic E Rego
(74) *Attorney, Agent, or Firm* — Nixon Peabody LLP; Jeffrey L. Costellia

(57) ABSTRACT

To output a digital signal corresponding to illuminance without being adversely affected by circuit delay. A photoelectric conversion device includes a photoelectric conversion element; a ramp-wave output circuit; a first comparator for comparing the ramp-wave signal and a first potential; a second comparator for comparing the ramp-wave signal and a second potential; a flip-flop circuit for generating a clock signal whose frequency is changed in accordance with the amount of photocurrent; a circuit for calculating a negative OR of the output signal of the first comparator and the output signal of the second comparator; a counter circuit for counting the pulse number of the clock signal; and a pulse output circuit for generating a period during which the pulse number is counted in the counter circuit. The pulse output circuit includes a switch for stopping the generation of the period during which the pulse number is counted.

18 Claims, 16 Drawing Sheets

U.S. PATENT DOCUMENTS

| | | | |
|---|---|---|---|
| 5,990,948 A | 11/1999 | Sugiki | |
| 6,031,219 A * | 2/2000 | Shuke | 250/214 R |
| 6,140,878 A * | 10/2000 | Masuta | 330/308 |
| 6,300,615 B1 * | 10/2001 | Shinohara et al. | 250/214 R |
| 6,350,981 B1 * | 2/2002 | Uno | 250/214 R |
| 6,525,858 B1 * | 2/2003 | Nagahori | 398/208 |
| 6,556,155 B1 | 4/2003 | Wiles, Jr. | |
| 6,650,403 B2 * | 11/2003 | Ogawa et al. | 356/5.01 |
| 6,707,023 B2 * | 3/2004 | Fong et al. | 250/214 A |
| 6,734,907 B1 * | 5/2004 | Hagihara et al. | 348/308 |
| 6,936,904 B2 | 8/2005 | Toyoda et al. | |
| 7,532,044 B2 | 5/2009 | Suzuki et al. | |
| 7,532,145 B2 | 5/2009 | Davidovici | |
| 7,605,355 B2 | 10/2009 | Davidovici | |
| 7,737,478 B2 * | 6/2010 | Yanagisawa et al. | 257/292 |
| 2001/0008456 A1 * | 7/2001 | Chiku et al. | 359/238 |
| 2001/0048140 A1 | 12/2001 | Toyoda et al. | |
| 2001/0050333 A1 * | 12/2001 | Feng et al. | 250/214 A |
| 2003/0222206 A1 | 12/2003 | Azary et al. | |
| 2004/0061193 A1 | 4/2004 | Toyoda et al. | |
| 2004/0173729 A1 * | 9/2004 | Shimizu et al. | 250/214 R |
| 2005/0045807 A1 * | 3/2005 | Sakaguchi | 250/214 R |
| 2006/0077169 A1 | 4/2006 | Fujikawa | |
| 2006/0273830 A1 | 12/2006 | Suzuki et al. | |
| 2007/0064128 A1 | 3/2007 | Davidovici | |
| 2007/0064146 A1 | 3/2007 | Davidovici | |
| 2007/0085529 A1 | 4/2007 | Davidovici | |
| 2008/0054159 A1 | 3/2008 | Yu et al. | |
| 2008/0158137 A1 | 7/2008 | Yoshida | |
| 2008/0204085 A1 | 8/2008 | Suzuki et al. | |
| 2008/0252762 A1 * | 10/2008 | Iwamoto et al. | 348/301 |
| 2009/0289174 A1 | 11/2009 | Koyama et al. | |
| 2009/0324244 A1 | 12/2009 | Koyama et al. | |

FOREIGN PATENT DOCUMENTS

| | | |
|---|---|---|
| EP | 1 767 911 A1 | 3/2007 |
| JP | 06-313840 | 11/1994 |
| JP | 10-284712 | 10/1998 |
| JP | 10-284752 | 10/1998 |
| JP | 2002-286504 | 10/2002 |
| JP | 2004-325409 | 11/2004 |
| JP | 2006-112794 | 4/2006 |
| JP | 2006-118965 | 5/2006 |
| JP | 2008-182219 | 8/2008 |
| WO | WO 2007/035858 A3 | 3/2007 |
| WO | WO 2007/035860 A2 | 3/2007 |
| WO | WO 2007/035861 A2 | 3/2007 |
| WO | WO 2007/044191 A2 | 4/2007 |

OTHER PUBLICATIONS

Written Opinion (Application No. PCT/JP2009/063717) dated Nov. 10, 2009.

* cited by examiner

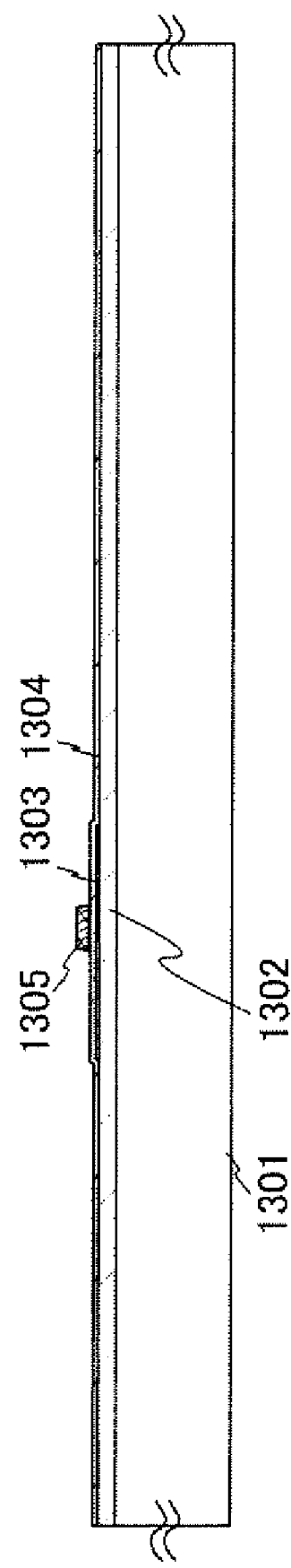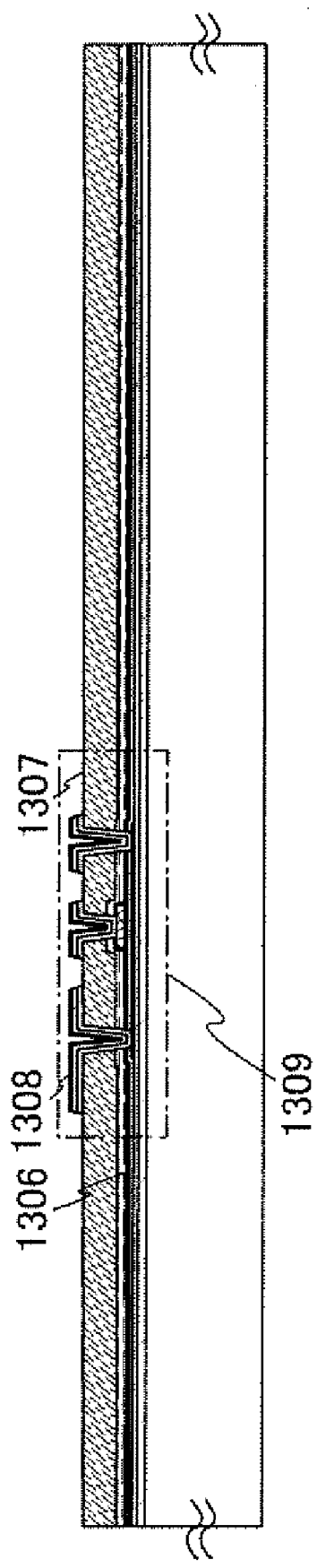

PHOTOELECTRIC CONVERSION DEVICE AND ELECTRONIC DEVICE HAVING THE SAME

TECHNICAL FIELD

The present invention relates to photoelectric conversion devices. Further, the present invention relates to electronic devices having the photoelectric conversion devices.

BACKGROUND ART

A large number of photoelectric conversion devices used for detecting light are known. For example, visible light sensors or the like have been put into practical use. A large number of photoelectric conversion devices are used for devices which need illuminance adjustment, on/off control, or the like depending on human living environment.

In some display devices, ambient brightness of the display devices is detected so that display luminance is adjusted. This is because visibility can be improved and wasted power consumption can be reduced by detecting ambient brightness with photoelectric conversion devices so that appropriate display luminance is obtained. For example, examples of display devices having photoelectric conversion devices for adjusting luminance are mobile phones and computers having display portions.

A photoelectric conversion device includes a photoelectric conversion element such as a photodiode for a light sensing portion and can detect illuminance based on the amount of current flowing to the photoelectric conversion element. Reference 1 discloses a structure where current flowing from a photodiode is converted into a ramp-wave signal whose frequency is changed in accordance with the amount of the current and the converted ramp-wave signal is output as a digital signal.

REFERENCE

Reference 1. U.S. Pat. No. 6,556,155

DISCLOSURE OF INVENTION

In a photoelectric conversion device disclosed in Reference 1, in the case where the amount of current corresponding to the amount of incident light flowing to a photodiode is large, the frequency of a ramp wave is increased. As the frequency of the ramp wave is increased, a signal having the ramp wave is more likely to be adversely affected by circuit delay due to a parasitic capacitance and/or frequency characteristics or the like of a comparator. Therefore, the signal having the ramp wave has a problem of being more adversely affected by circuit delay as the frequency is increased, which results in large variations in output signals corresponding to illuminance.

It is an object of an embodiment of the present invention to provide a photoelectric conversion device in which a signal having a ramp wave with frequency corresponding to illuminance can be output as a digital signal without being adversely affected by circuit delay due to parasitic capacitance or the like.

An embodiment of the present invention is a photoelectric conversion device which includes a photoelectric conversion element for generating photocurrent; a ramp-wave output circuit for outputting a ramp-wave signal having frequency corresponding to the amount of the photocurrent; a first comparator for comparing the ramp-wave signal and a first potential with each other; a second comparator for comparing the ramp-wave signal and a second potential with each other; a flip-flop circuit for generating a clock signal whose frequency is changed in accordance with the amount of the photocurrent by input of an output signal of the first comparator and an output signal of the second comparator; a circuit for calculating a negative OR of the output signal of the first comparator and the output signal of the second comparator; a counter circuit for counting the pulse number of the clock signal; and a pulse output circuit for generating a period during which the pulse number is counted in the counter circuit. The pulse output circuit includes a switch for stopping the generation of the period during which the pulse number is counted in accordance with an output signal of the circuit for calculating the negative OR.

According to the embodiment of the present invention, it is possible to provide a photoelectric conversion device in which a signal having a ramp wave with frequency corresponding to illuminance can he converted into a digital signal without being adversely affected by circuit delay due to parasitic capacitance or the like.

BRIEF DESCRIPTION OF THE DRAWINGS

In the accompanying drawings:

FIGS. 13A to 13D are cross-sectional views for illustrating Embodiment 3.

BEST MODE FOR CARRYING OUT THE INVENTION

Figure 1:
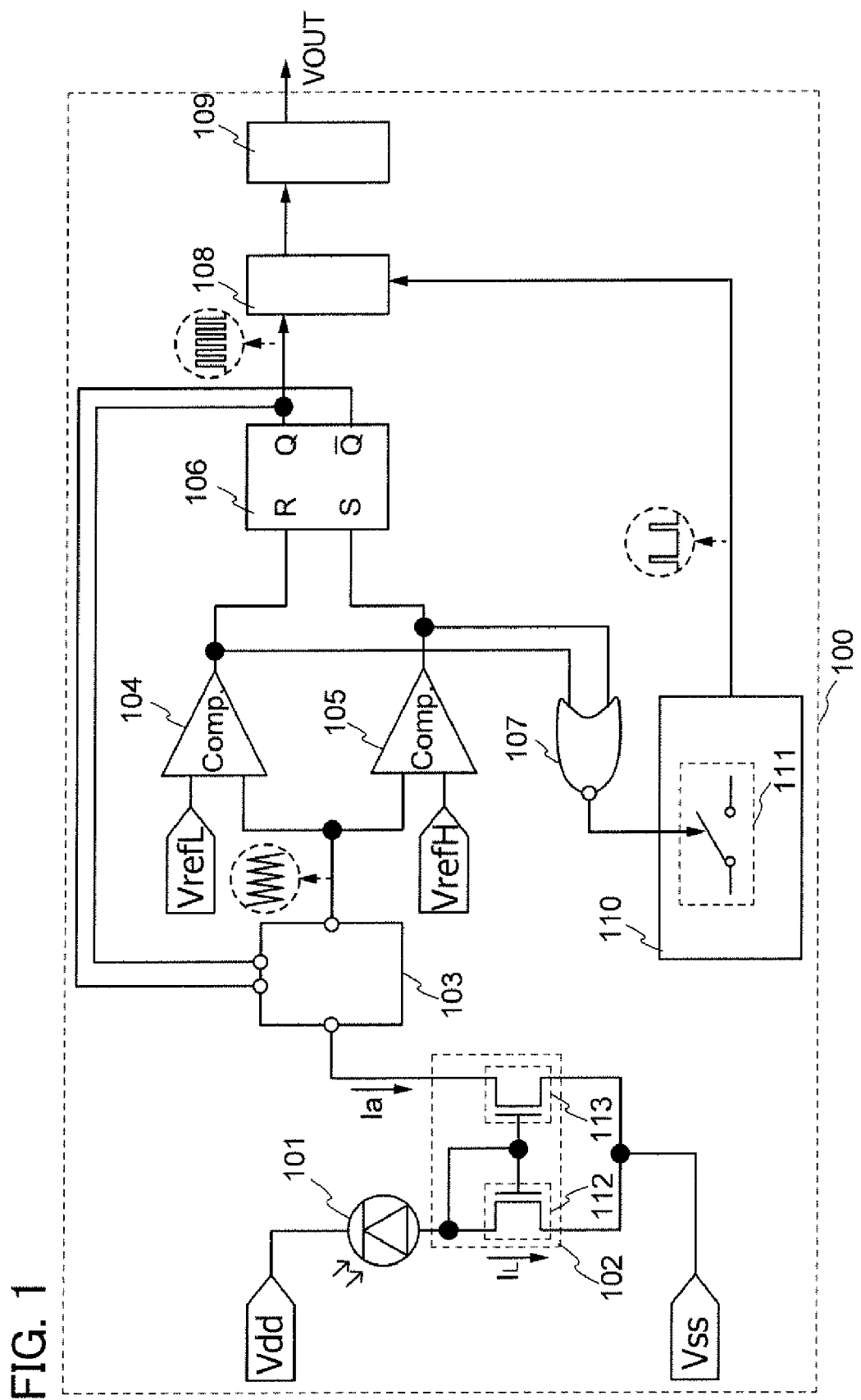
FIG. 1 is a circuit diagram for illustrating Embodiment 1.

Hereinafter, embodiments of the present invention will be described with reference to the drawings. Note that the present invention can be implemented in various different ways and it will be readily appreciated by those skilled in the art that various changes and modifications are possible without departing from the spirit and scope of the present invention. Therefore, the present invention should not be construed as being limited to the following description of the embodiments. Note that in all the drawings for illustrating the embodiments, the same portions or portions having similar functions are denoted by the same reference numerals, and description thereof is not repeated.

Embodiment 1

The structure and operation of a photoelectric conversion device according to an embodiment of the present invention are described in this embodiment.

First, a circuit diagram of the photoelectric conversion device according to an embodiment of the present invention is described. A photoelectric conversion device 100 illustrated in FIG. 1 includes a photoelectric conversion element 101, an amplifier circuit 102, a ramp-wave output circuit 103, a first comparator 104, a second comparator 105, a flip-flop circuit 106, a NOR circuit 107 (also referred to as a negative OR circuit), a counter circuit 108, a latch circuit 109, and a pulse output circuit 110.

In the photoelectric conversion element 101, a high power supply potential (Vdd) is supplied to one of terminals (an n-type semiconductor side) and the other of the terminals (a p-type semiconductor side) is electrically connected to the amplifier circuit 102 so that photocurrent $I_L$ is supplied to the amplifier circuit 102. The amplifier circuit 102 is a circuit for amplifying the photocurrent $I_L$ in the photoelectric conversion element 101 to current Ia. In addition, a low power supply potential (Vss) is supplied to the amplifier circuit 102. The ramp-wave output circuit 103 is a circuit for outputting a ramp-wave signal whose frequency is changed in accordance with the current Ia (hereinafter referred to as a ramp-wave signal). An input terminal of the ramp-wave output circuit 103 is electrically connected to the amplifier circuit 102. An output terminal of the ramp-wave output circuit 103 is electrically connected to the first comparator 104 and the second comparator 105. The first comparator 104 is a circuit for comparing a first potential VrefL and a potential of the ramp-wave signal with each other and for outputting a high-potential signal (hereinafter referred to as an H-level signal) in the case where the first potential VrefL is higher than the potential of the ramp-wave signal. The second comparator 105 is a circuit for comparing a second potential VrefH and a potential of an output signal of the ramp-wave signal with each other and for outputting the H-level signal in the case where the second potential VrefH is lower than the potential of the output signal of the ramp-wave signal. As the flip-flop circuit 106, an RS-flip-flop circuit is illustrated as an example. An output signal of the first comparator 104 is input to an R terminal, and an output signal of the second comparator 105 is input to an S terminal. The NOR circuit 107 is a circuit for calculating a negative OR of the output signals of the first comparator 104 and the second comparator 105 so that the logic of the output signal is determined. The counter circuit 108 and the latch circuit 109 are electrically connected to each other through a bus corresponding to the number of bits of a count value. The counter circuit 108 is a circuit for counting the number of pulses of an output signal from a Q terminal of the flip-flop circuit 106 (hereinafter referred to as a clock signal) for a predetermined period. The latch circuit 109 is a circuit for latching a count value obtained by counting the number of the pulses of the clock signal for the predetermined period in the counter circuit 108 and for outputting the count value as an output signal of the photoelectric conversion device. The pulse output circuit 110 is a circuit for generating a period during which the number of pulses of the clock signal is counted in the counter circuit 108.

A switch 111 is provided inside the pulse output circuit 110. The switch 111 performs intermittent operation in accordance with the output signal from the NOR circuit 107. The switch 111 is on in the case where the output signal from the NOR circuit 107 is the H-level signal and is off in the case where the output signal from the NOR circuit 107 is a low-potential signal (hereinafter referred to as an L-level signal). In addition, for example, as illustrated in FIG. 1, the amplifier circuit 102 is formed using a current mirror circuit and includes a first n-channel transistor 112 and a second n-channel transistor 113. A first terminal of the first n-channel transistor 112 is electrically connected to the p-type semiconductor side of the photoelectric conversion element 101. Gate terminals of the first n-channel transistor 112 and the second n-channel transistor 113 are electrically connected to each other. The first terminal of the first n-channel transistor 112 is electrically connected to the gate terminals of the first n-channel transistor 112 and the second n-channel transistor 113. The low power supply potential (Vss) is supplied to second terminals of the first n-channel transistor 112 and the second n-channel transistor 113.

Note that in this specification, terms such as "first", "second", "third", and "N-th" (N is a natural number) are used in order to avoid confusion among components and do not limit the components numerically.

Note that in this specification, when it is described that "A and B are connected to each other", the case where A and B are electrically connected to each other is included in addition to the case where A and B are directly connected to each other. Here, when it is described that "A and B are electrically connected to each other", the case where A and B have the same or substantially the same nodes with an object interposed therebetween when the object having any electrical function is interposed between A and B is included.

Specifically, the case where it is acceptable that A and B have the same nodes considering a circuit operation, for example, the case where A and B are connected to each other with a switching element such as a transistor interposed therebetween and have the same or substantially the same potentials by conduction of the switching element, the case where A and B are connected to each other with a resistor interposed therebetween and a difference between potentials applied to opposite ends of the resistor does not adversely affect the operation of a circuit including A and B, or the like is included.

Note that in this specification, any switch may be used as long as it can control conduction and non-conduction between one of terminals and the other of the terminals, without limitation on a certain type. As the switch, an electrical switch, a mechanical switch, or the like can be used. For example, an analog switch or the like may be formed using a thin film transistor.

Note that a PIN photodiode may be used as the photoelectric conversion element 101. Alternatively, instead of a PIN photodiode, a PN photodiode may be used as the photoelectric conversion element 101.

Figure 2A:
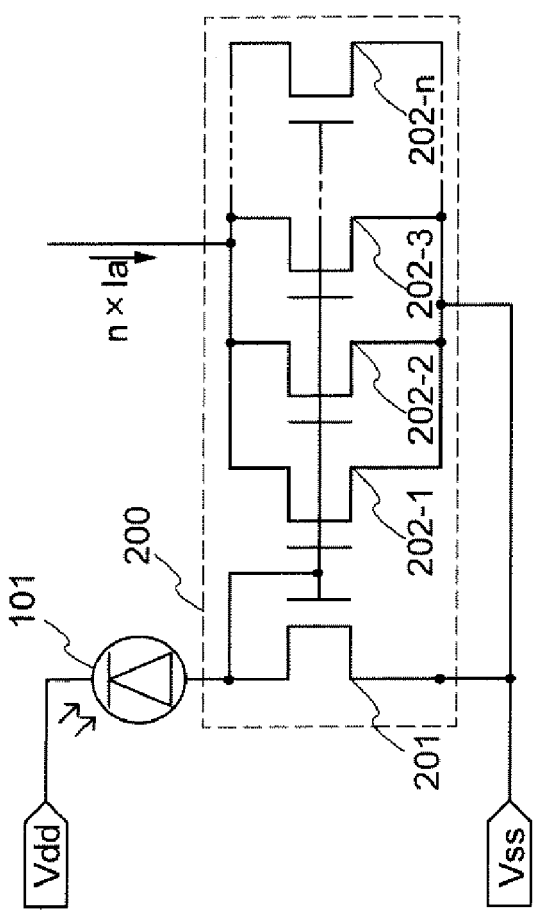
FIGS. 2A and 2B are circuit diagrams for illustrating Embodiment 1.

As the amplifier circuit 102, a circuit for amplifying the photocurrent $I_L$ output from the photoelectric conversion element n-fold (n is a positive number) the current Ia may be used. For example, by providing a plurality of second n-channel transistors 202-1 to 202-n (n is a natural number more than or equal to two) as in an amplifier circuit 200 illustrated in FIG. 2A, the amplifier circuit 102 can supply the current Ia n-fold. Therefore, even in the case where the amount of incident light which is delivered to the photoelectric conversion element 101 is small, sufficient current can be supplied to a second n-channel transistors 202-1 to 202-n side. Alternatively, by increasing the channel width of the second n-channel transistor 201 or decreasing the channel length of the second n-channel transistor 201, sufficient current can be supplied.

Figure 2B:
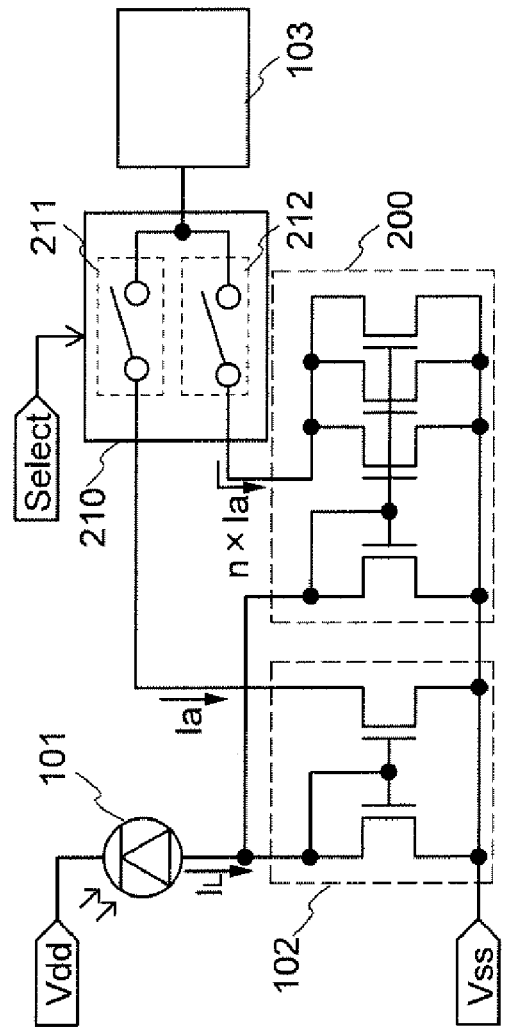

Alternatively, a structure of the amplifier circuit 102 may be used in which the amplification factor of the photocurrent $I_L$ is switched in accordance with illuminance in the amplifier circuit 102. FIG. 2B illustrates a structure in which the amplification factor of the photocurrent is switched in accordance with illuminance. For example, the amplifier circuit 102 and the amplifier circuit 200 are used as circuits for amplifying the photocurrent $I_L$ from the photoelectric conversion element 101, and a switching circuit 210 for switching the circuits for amplifying the photocurrent $I_L$ in accordance with a selection signal Select is provided. The switching circuit 210 includes a first switch 211 and a second switch 212 and switches the amplifier circuits electrically connected to the ramp-wave output circuit 103 in accordance with the selection signal Select. Note that by providing amplifier circuits having a plurality of different amplification factors and switching the amplifier circuits by the switching circuit 210, the amplification factor of the photocurrent $I_L$, which corresponds to illuminance, can be optimized.

Note that a transistor such as an n-channel transistor or a p-channel transistor is an element which includes at least three terminals of a gate, a drain, and a source. The transistor has a channel region between a drain region and a source region and can supply current through the drain region, the channel region, and the source region. Here, since the source and the drain change depending on the structure, the operating condition, and the like of the transistor, it is difficult to define which is a source or a drain. Therefore, in this embodiment, regions which serves as the source and the drain are referred to as a first terminal and a second terminal in some cases. Further, a terminal which serves as the gate is referred to as a gate terminal in some cases.

Note that any of a variety of transistors can be used as a transistor such as an n-channel transistor or a p-channel transistor. For example, a thin film transistor (TFT) including a non-single crystal semiconductor film typified by amorphous silicon, polycrystalline silicon, microcrystalline (also referred to as microcrystal or semi-amorphous) silicon, or the like can be used. In the case of TFTs, since TFTs can be formed through a process at comparatively lower temperature, a large manufacturing apparatus can be used and the TFTs can be formed using a large substrate. Therefore, many TFTs can be manufactured in one manufacturing process at low cost. In addition, since the TFTs can be formed through the process at comparatively lower temperature, a substrate having low heat resistance can be used. Therefore, such a transistor can be formed using a light-transmitting substrate (e.g., a glass substrate having an insulating surface) and can be used for a device in which transmission of light is utilized.

Figure 3:
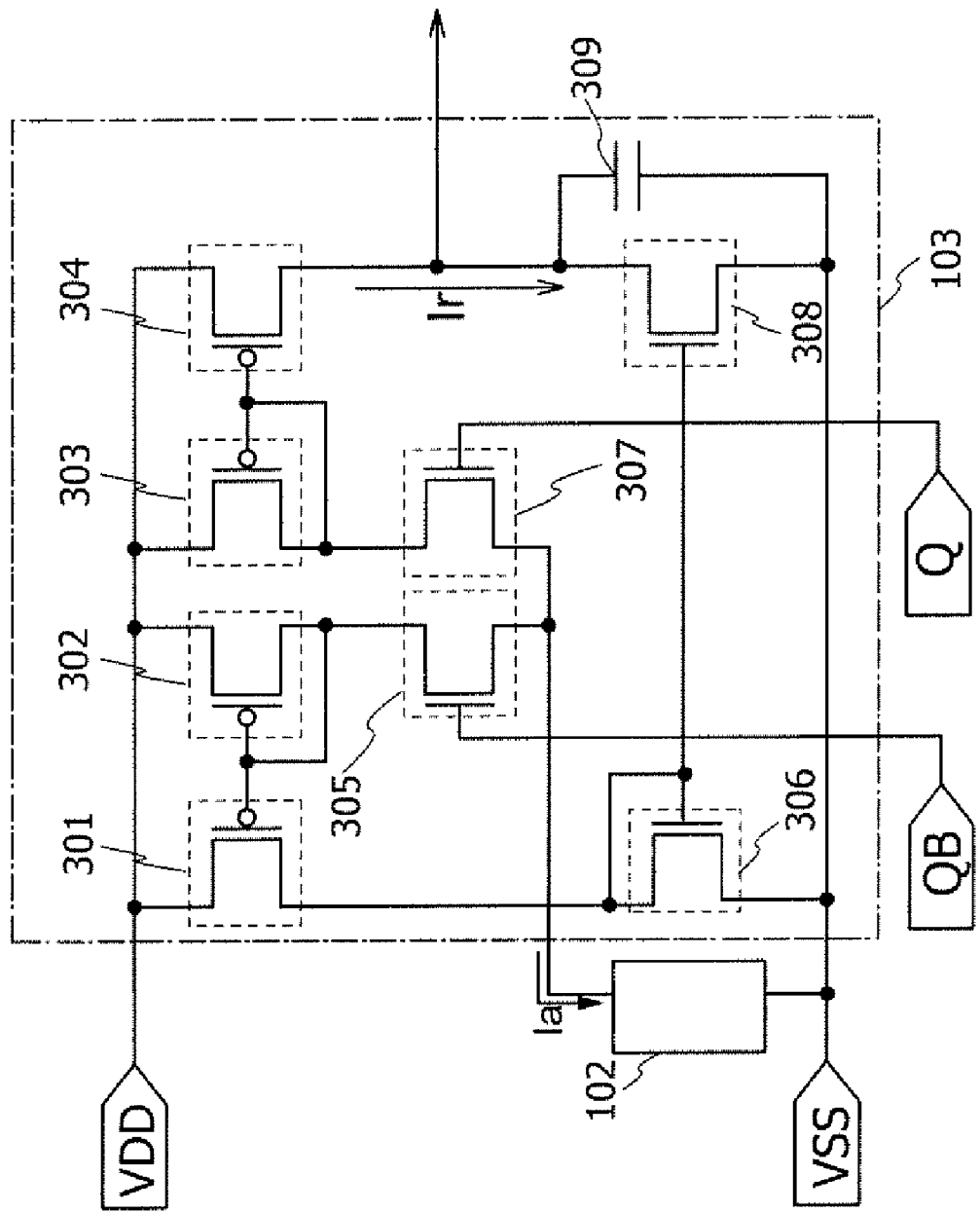
FIG. 3 is a circuit diagram for illustrating Embodiment 1.

The ramp-wave output circuit 103 includes a p-channel transistor 301, a p-channel transistor 302, a p-channel transistor 303, a p-channel transistor 304, an n-channel transistor 305, an n-channel transistor 306, an n-channel transistor 307, an n-channel transistor 308, and a capacitor 309 which are connected as illustrated in FIG. 3. The p-channel transistor 301 and the p-channel transistor 302 form a current mirror circuit. The p-channel transistor 303 and the p-channel transistor 304 form a current mirror circuit. An inverted clock signal QB is input to a gate of the n-channel transistor 305. A clock signal Q is input to a gate of the n-channel transistor 307. The n-channel transistor 306 and the n-channel transistor 308 form a current mirror circuit. Source terminals of the n-channel transistor 305 and the n-channel transistor 307 are electrically connected to the amplifier circuit 102, and the current Ia corresponding to the amplification factor of the amplifier circuit 102 flows. In the ramp-wave output circuit 103 illustrated in FIG. 3, the capacitor 309 repeats charging and discharging with the current Ir flowing to the p-channel transistor 304 or the n-channel transistor 308. Therefore, the ramp-wave signal is output from the ramp-wave output circuit 103 to the first comparator 104 and the second comparator 105.

Note that the clock signal Q and the inverted clock signal QB which are input to the ramp-wave output circuit 103 are signals which are output from the Q terminal and the QB terminal of the flip-flop circuit 106.

The first comparator 104 compares the first potential VrefL and the potential of the ramp-wave signal with each other. Since the H-level signal is output in the case where the first potential VrefL is higher than the potential of the ramp-wave signal, it is acceptable as long as the first potential VrefL is input to a non-inverting input terminal and the ramp-wave signal is input to an inverting input terminal. In addition, the second comparator 105 compares the second potential VrefH and the potential of the ramp-wave signal with each other. Since the H-level signal is output in the case where the second potential VrefH is lower than the potential of the ramp-wave signal, it is acceptable as long as the ramp-wave signal is input to the non-inverting input terminal and the second potential VrefH is input to the inverting input terminal.

FIG. 1 illustrates the case where the flip-flop circuit 106 is the RS flip-flop circuit. The output signal of the first comparator 104 is input to the R terminal. The output signal of the second comparator 105 is input to the S terminal. The clock signal is output from the Q terminal of the flip-flop circuit 106 and is input to the counter circuit 108 and the ramp-wave output circuit 103. The inverted clock signal is output from the QB terminal of the flip-flop circuit 106 and is input to the ramp-wave output circuit 103.

Note that in the ramp-wave output circuit 103, the n-channel transistor 305 and the n-channel transistor 307 are alternately turned on and off by the clock signal and the inverted clock signal, so that the current Ir flows to the p-channel transistor 304 or the n-channel transistor 308. Since the capacitor 309 repeats charging and discharging when the current Ir flows, the ramp-wave signal is output to the capacitor 309. Here, frequency f of the ramp-wave signal which is output from the ramp-wave output circuit 103 is expressed as follows with the current Ir, capacitance C of the capacitor 309, the first potential VrefL, and the second potential VrefH. From Formula 1, it can be seen that an output signal whose frequency is changed in accordance with the amount of the current Ir can be obtained.

[Formula 1]

$$f = \frac{Ir}{2C(VrefH - VrefL)} \quad (1)$$

Figure 4A:
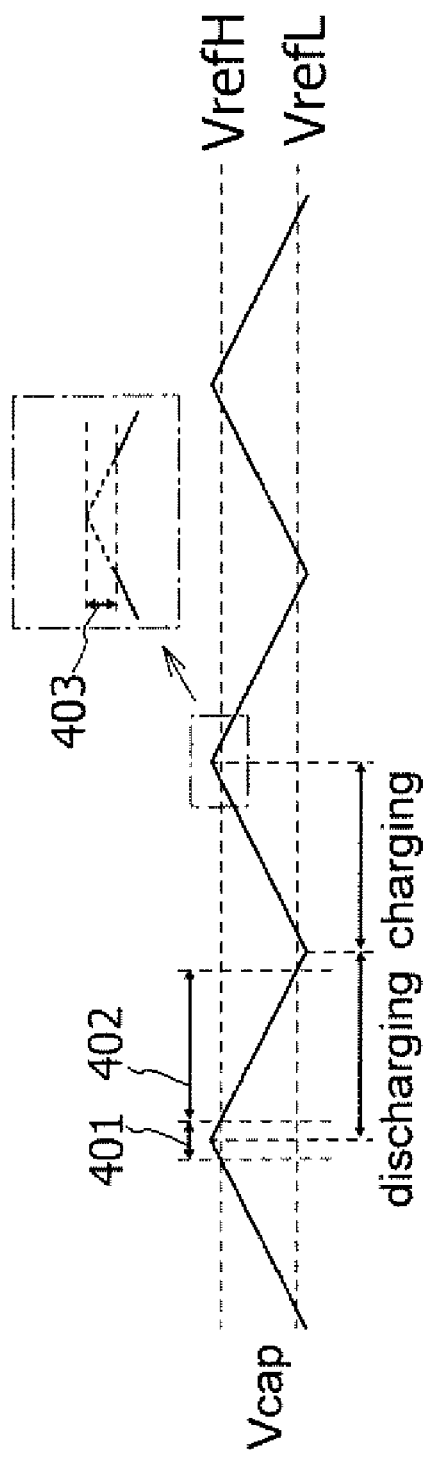
FIGS. 4A and 4B are diagrams for illustrating Embodiment 1.
Figure 4B:
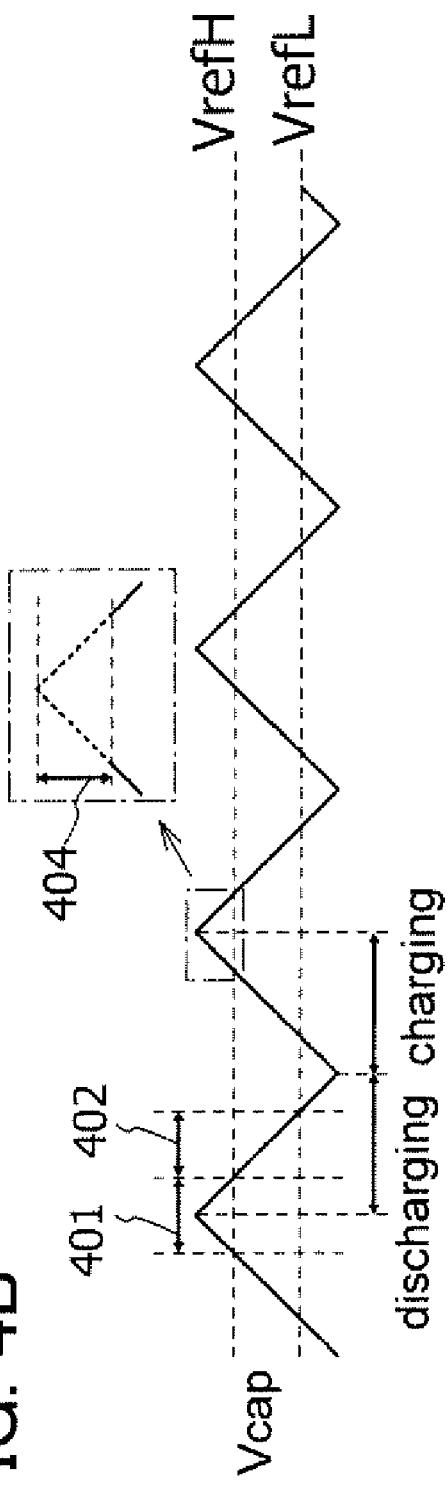

The ramp-wave signal which is output from the ramp-wave output circuit 103 illustrated in FIG. 3 is described with reference to FIGS. 4A and 4B. In a ramp wave illustrated in FIG. 4A, a ramp-wave signal in the case where the amount of light delivered to the photoelectric conversion element is small is illustrated. In a ramp wave illustrated in FIG. 4B, a ramp-wave signal in the case where the amount of light delivered to the photoelectric conversion element is large is illustrated. As illustrated in FIGS. 4A and 4B, the capacitor 309 repeats charging and discharging with the current Ir between the first potential VrefL and the second potential VrefH (also referred to as bandgap reference) as a potential of the ramp-wave signal (in the diagram, denoted by Vcap). Therefore, frequencies are different between the case where the illuminance of the photoelectric conversion element is low and the case where the illuminance of the photoelectric conversion element is high, as expressed in Formula 1.

As the frequency of signals becomes higher, circuit delay is more likely to occur due to wiring resistance, parasitic capacitance, or the like. Therefore, in FIGS. 4A and 4B, as for a first period 401 and a second period 402, the first period 401 is a period during which charging and discharging are switched not between the first potential VrefL and the second potential VrefH, and the second period 402 is a period during which charging and discharging are switched between the first potential VrefL and the second potential VrefH. The length of the first period 401 becomes longer as the frequency becomes higher as illustrated by an arrow 403 and an arrow 404 in FIGS. 4A and 4B, which cause variations when wave numbers are counted in the counter circuit 108 which is in a subsequent stage.

Note that in the counter circuit 108, counting corresponding to the given to number of bits is performed in a period corresponding to output from the pulse output circuit 110. A count value is incremented in accordance with the number of pulses of the clock signal which is output from the Q terminal of the flip-flop circuit 106. Note that with completion of the period corresponding to the output from the pulse output circuit 110, the counter circuit 108 resets the count value and performs counting in a counter again. The obtained count value is output to the latch circuit 109. The count value which is latched in the latch circuit 109 is a digital output signal "Vout" from the photoelectric conversion device.

The NOR circuit 107 is a circuit for calculating a negative OR of the output signals of the first comparator 104 and the second comparator 105 so that the logic of the output signal is determined.

The pulse output circuit 110 is a circuit for generating a period during which the number of pulses of the clock signal is counted in the counter circuit 108. The switch 111 is provided inside the pulse output circuit 110. The switch 111 is alternately turned on and off in accordance with the output signal from the NOR circuit 107. For example, as the switch 111, a switch which is on in the case where the output signal from the NOR circuit 107 is the H-level signal and is off in the case where the output signal from the NOR circuit 107 is the L-level signal may be used.

A specific structure of the pulse output circuit 110 including the switch 111 is described with reference to FIGS. 5A and 5B.

Figure 5A:
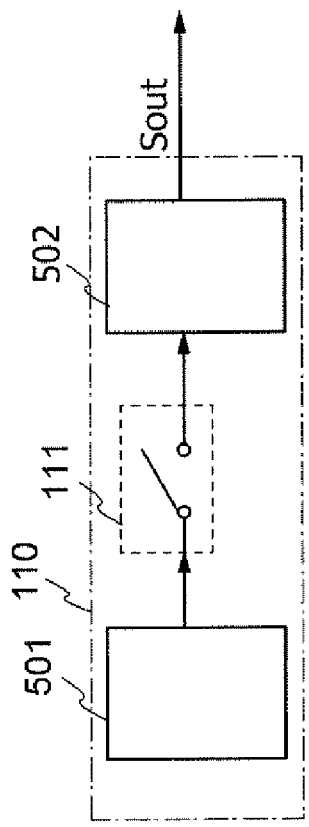
FIGS. 5A and 5B are circuit diagrams for illustrating Embodiment 1.

The pulse output circuit 110 illustrated in FIG. 5A includes an oscillator circuit 501, the switch 111, and a counter circuit 502. The oscillator circuit 501 is a circuit for dividing the frequency of a signal which is output from a ring oscillator, a crystal oscillator, or the like and for outputting a signal having desired frequency. In addition, the counter circuit 502 is a circuit for counting the wave number of a signal from the oscillator circuit 501, which is input through the switch 111, and for outputting a pulse "Sout" when a count value reaches a predetermined count value.

The operation of the pulse output circuit 110 illustrated in FIG. 5A is described with reference to a timing chart in FIG. 6. Note that in FIG. 6, a period 601 is a period during which the amount of light delivered to the photoelectric conversion element is small. Further, a period 602 is a period during which the amount of light delivered to the photoelectric conversion element is large.

Figure 6:
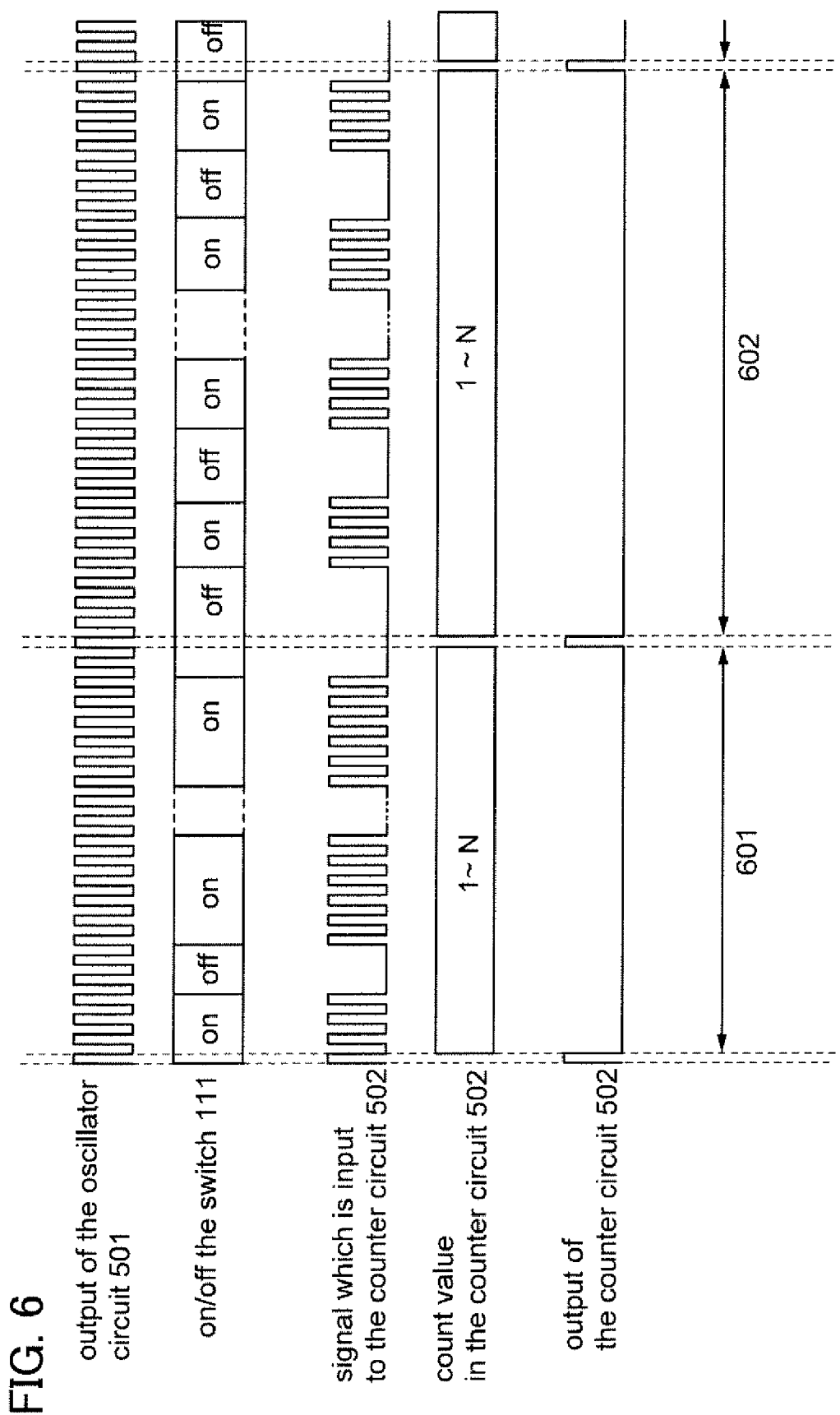
FIG. 6 is a timing chart for illustrating Embodiment 1.

The timing chart illustrated in FIG. 6 illustrates output of the oscillator circuit 501, on/off of the switch 111, a signal which is input to the counter circuit 502, a count value in the counter circuit 502, and output of the counter circuit 502. As illustrated in FIG. 6, as the output of the oscillator circuit 501, a signal having certain frequency is output. The switch 111 is repeatedly turned on or off in accordance with a signal which is input to the NOR circuit 107. FIG. 6 illustrates an example in which the switch 111 is alternately turned on and off repeatedly. The signal which is input to the counter circuit 502 is a signal which is the same as the output of the oscillator circuit 501 only in a period during which the switch 111 is on. In the counter circuit 502, counting is incremented in accordance with the wave number of the signal which is input to the counter circuit 502 from the count value of 1 to N (N is a given natural number). As the output of the counter circuit 502, a pulse is output when the account value counted in the counter circuit 502 is counted up to N so as to be the pulse "Sout" of the pulse output circuit 110.

As described above, the period 601 is a period during which the amount of light delivered to the photoelectric conversion element is small, and the period 602 is a period during which the amount of light delivered to the photoelectric conversion element is large. Therefore, as illustrated in FIGS. 4A and 4B, deviation from the bandgap reference is greater in the period 602 than in the period 601, so that a period for correction is increased. By controlling on/off of the switch 111 as illustrated in FIG. 6, the supply of a signal which is output from the pulse output circuit 110 is stopped in accordance with the ramp-wave signal, so that variations can be controlled.

Figure 5B:
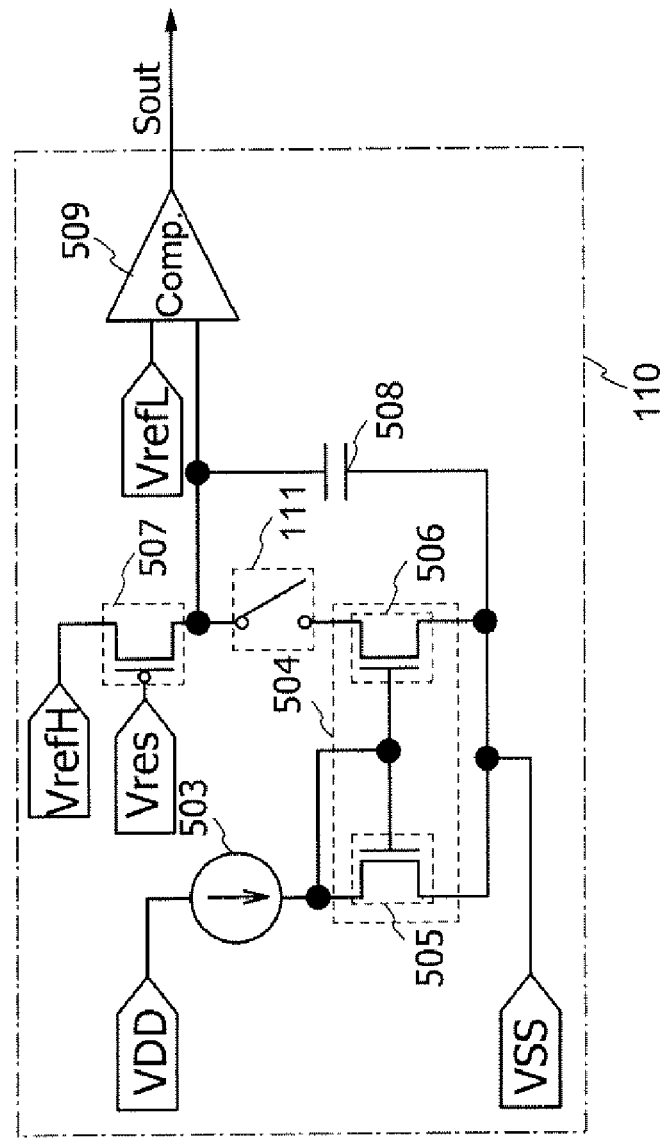

The pulse output circuit 110 illustrated in FIG. 5B includes a constant current circuit 503, a current mirror circuit 504 including a transistor 505 and a transistor 506, the switch 111, a transistor 507, a capacitor 508, and a comparator 509. The constant current circuit 503 is a circuit for generating constant current. The current mirror circuit 504 including the transistor 505 and the transistor 506 is a circuit for controlling discharging of the capacitor 508 in accordance with the amount of constant current in the constant current circuit 503. The transistor 507 is an element for controlling timing for charging the capacitor 508 at the second potential VrefH by a reset signal Vres. Note that although the transistor 507 is a p-channel transistor in FIG. 5B, the transistor 507 may be a switch. When the capacitor 508 repeats charging and discharging, the capacitor 508 obtains a potential of a node which is electrically connected to the comparator 509. The comparator 509 is a circuit for comparing a potential of a node to which the capacitor 508 is connected and the first potential VrefH with each other and for outputting an H-level signal in the case where the first potential VrefL is higher than the potential of the node to which the capacitor 508 is connected.

The operation of the pulse output circuit 110 illustrated in FIG. 5B is described with reference to a timing chart in FIG. 7. Note that in FIG. 7, a period 701 is a period during which the amount of light delivered to the photoelectric conversion element is small. Further, a period 702 is a period during which the amount of light delivered to the photoelectric conversion element is large.

Figure 7:
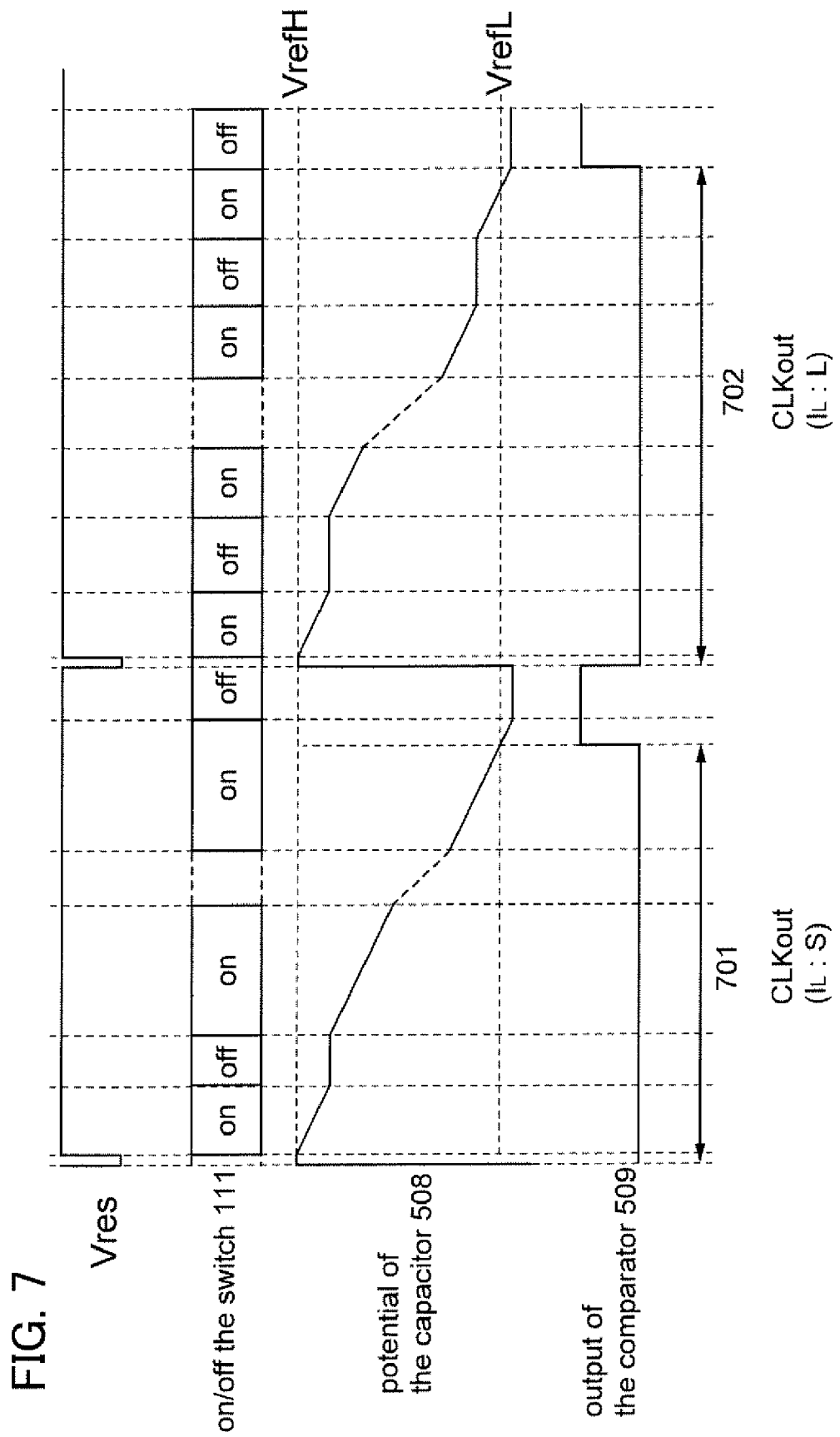
FIG. 7 is a timing chart for illustrating Embodiment 1.

The timing chart illustrated in FIG. 7 illustrates a potential of the reset signal Vres for controlling on/off of the transistor 507, on/off of the switch 111, a potential of the capacitor 508, and output of the comparator 509. As illustrated in FIG. 7, when the reset signal Vres is at a potential for turning on the transistor 507, the capacitor 508 is charged at the second potential VrefH, so that the potential of the node to which the capacitor 508 is connected rises. The switch 111 is repeatedly turned on and off in accordance with the signal which is input to the NOR circuit 107. FIG. 7 illustrates an example in which the switch 111 is alternately turned on and off repeatedly. The potential of the node to which the capacitor 508 is connected, in which the capacitor 508 is charged at the second potential VrefH, is lowered because the capacitor 508 is discharged every time the switch 111 is turned on. In the case where the switch 111 is off, discharging of the capacitor 508 is stopped and the potential is not changed. When the potential of the node to which the capacitor 508 is connected is lowered and is lower than the first potential VrefL, a pulse is output by inverting the output of the comparator 509 so as to be the pulse "Sout" of the pulse output circuit 110.

As described above, the period 701 is a period during which the amount of light delivered to the photoelectric conversion element is small, and the period 702 is a period during which the amount of light delivered to the photoelectric conversion element is large. Therefore, as illustrated in FIG. 4, deviation from the bandgap reference is greater in the period 702 than in the period 701, so that a period for correction is increased. By controlling on/off of the switch 111 as illustrated in FIG. 7, the supply of a signal which is output from the pulse output circuit 110 is stopped in accordance with the ramp-wave signal, so that variations can be controlled, in a manner similar to that of FIG. 6.

Next, timing charts about circuit diagrams and signals from the circuits illustrated in FIG. 1 to FIG. 7 are described with reference to FIG. 8 and FIG. 9. The timing charts in FIG. 8 and FIG. 9 illustrate the potential "Vcap" of the ramp-wave signal which is output from the ramp-wave output circuit 103, an output signal "C1out" of the first comparator 104, an output signal "C2out" of the second comparator 105, an output signal "NORout" of the NOR circuit 107, a clock signal "CLK" which is output of the Q terminal of the flip-flop circuit 106, the count value in the counter circuit 108, the output of the oscillator circuit 501, the signal which is input to the counter circuit 502, the count value in the counter circuit 502, and the potential of the capacitor 508.

Figure 8:
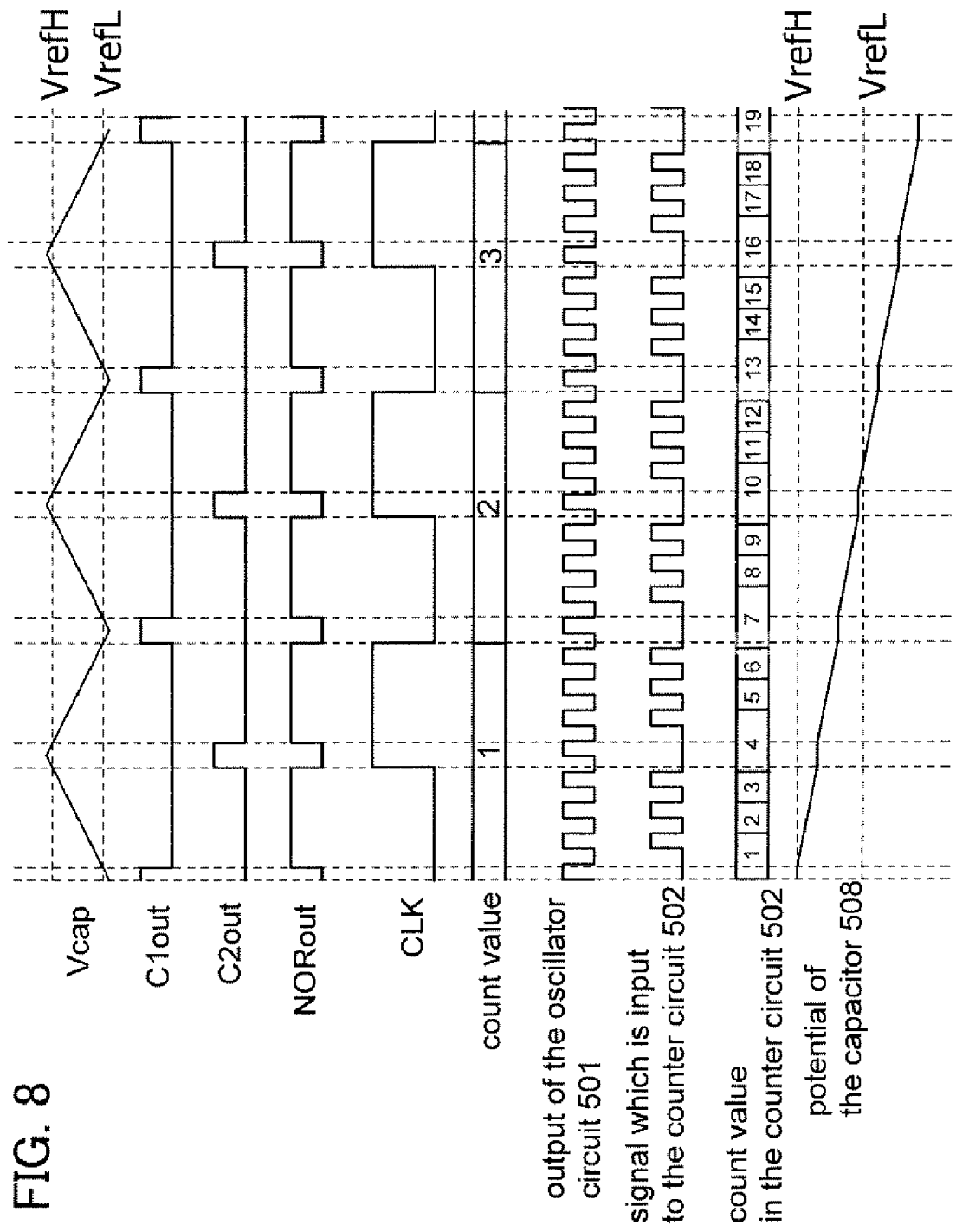
FIG. 8 is a timing chart for illustrating Embodiment 1.

Note that FIG. 8 illustrates the case where the amount of light delivered to the photoelectric conversion element is small. Further, FIG. 9 illustrates the case where the amount of light delivered to the photoelectric conversion element is large.

Figure 9:
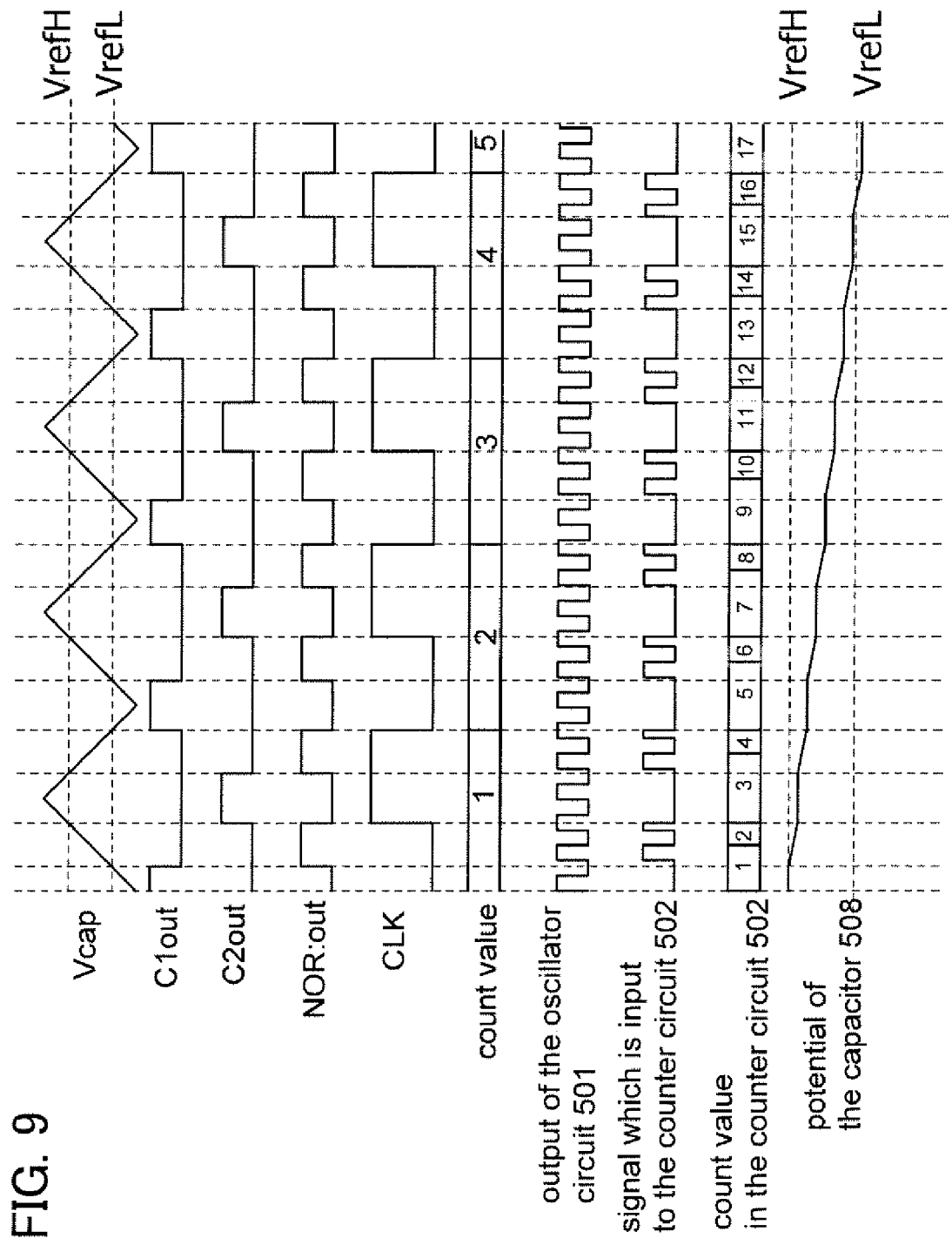
FIG. 9 is a timing chart for illustrating Embodiment 1.

In the timing charts illustrated in FIG. 8 and FIG. 9, the output signal "C1out" of the first comparator 104 and the output signal "C2out" of the second comparator 105 operate in accordance with the potential "Vcap" of the ramp-wave signal. Then, the output signal "NORout" of the NOR circuit 107 and the clock signal are output. Counting in the counter circuit 108 is controlled with a pulse from the pulse output circuit 110. In the pulse output circuit 110, the switch 111 in the pulse output circuit 110 is turned on or off in accordance with the output signal from the NOR circuit 107. Thus, as illustrated in FIGS. 5A and 5B, FIG. 6, and FIG. 7, output of the pulse output circuit 110 can be obtained.

Figure 10:
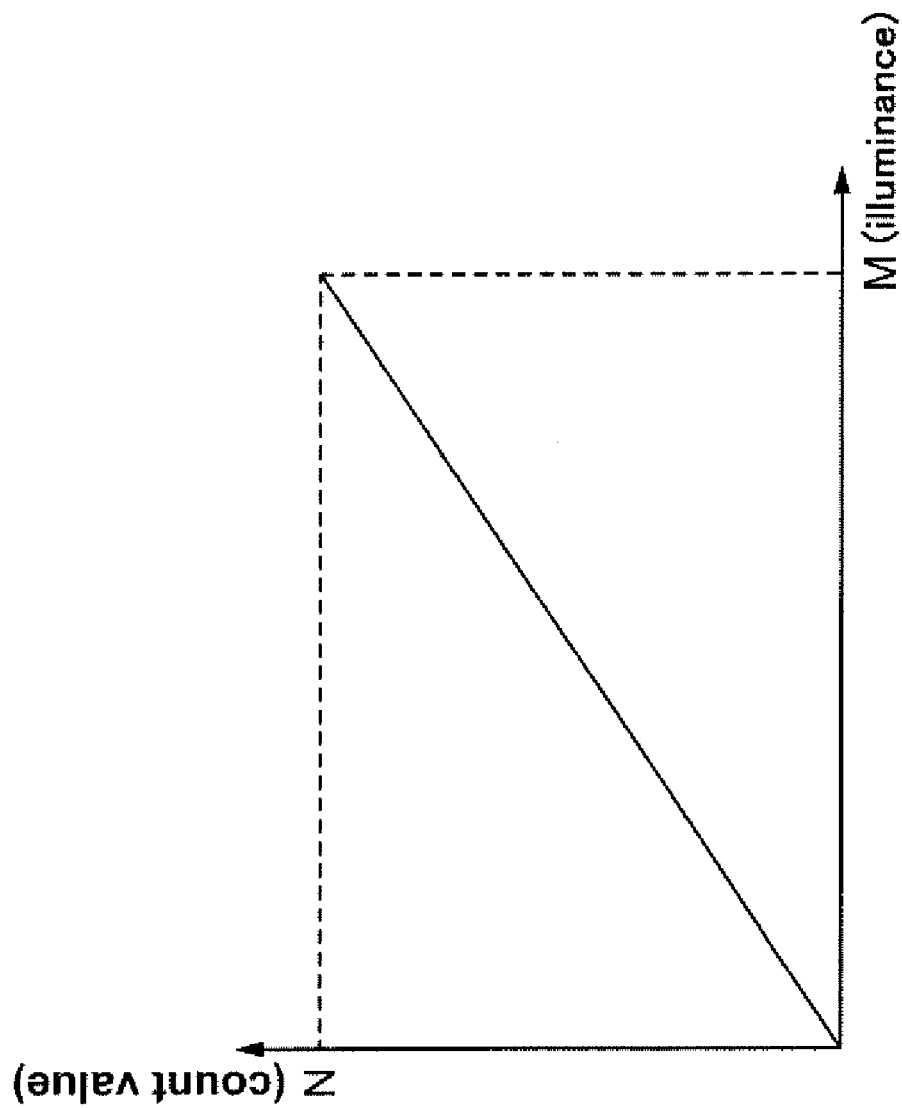
FIG. 10 is a graph for illustrating Embodiment 1.

In addition, FIG. 10 is a graph illustrating relationship in the case where the horizontal axis expresses illuminance and the vertical axis expresses a count value. As illustrated in FIG. 10, the graph is an upward-sloping graph where the count value is increased in accordance with increase in illuminance. Note that the upper limit of illuminance M is preferably set to approximately hundred thousand lux taking eye-spectral sensitivity into consideration. A count value N is set in accordance with the number of bits.

In the upward-sloping graph where the count value which corresponds to output voltage is increased in accordance with increase in illuminance, the output voltage saturates in accordance with illuminance. Therefore, by determining the output voltage in accordance with the upper limit of illuminance, the range of illuminance detection can be set.

As described above, in the structure of the photoelectric conversion device of this embodiment, a signal having a ramp wave with frequency corresponding to illuminance can be converted into a digital signal without being adversely affected by circuit delay due to parasitic capacitance or the like.

Note that the contents described in each drawing in this embodiment can be freely combined with or replaced with the contents described in any of the other embodiments as appropriate.

Embodiment 2

In this embodiment, a block diagram in which an external circuit to which a digital signal is output is added to the photoelectric conversion device illustrated in Embodiment 1 is described with reference to FIG. 11 and FIG. 12.

Figure 11:
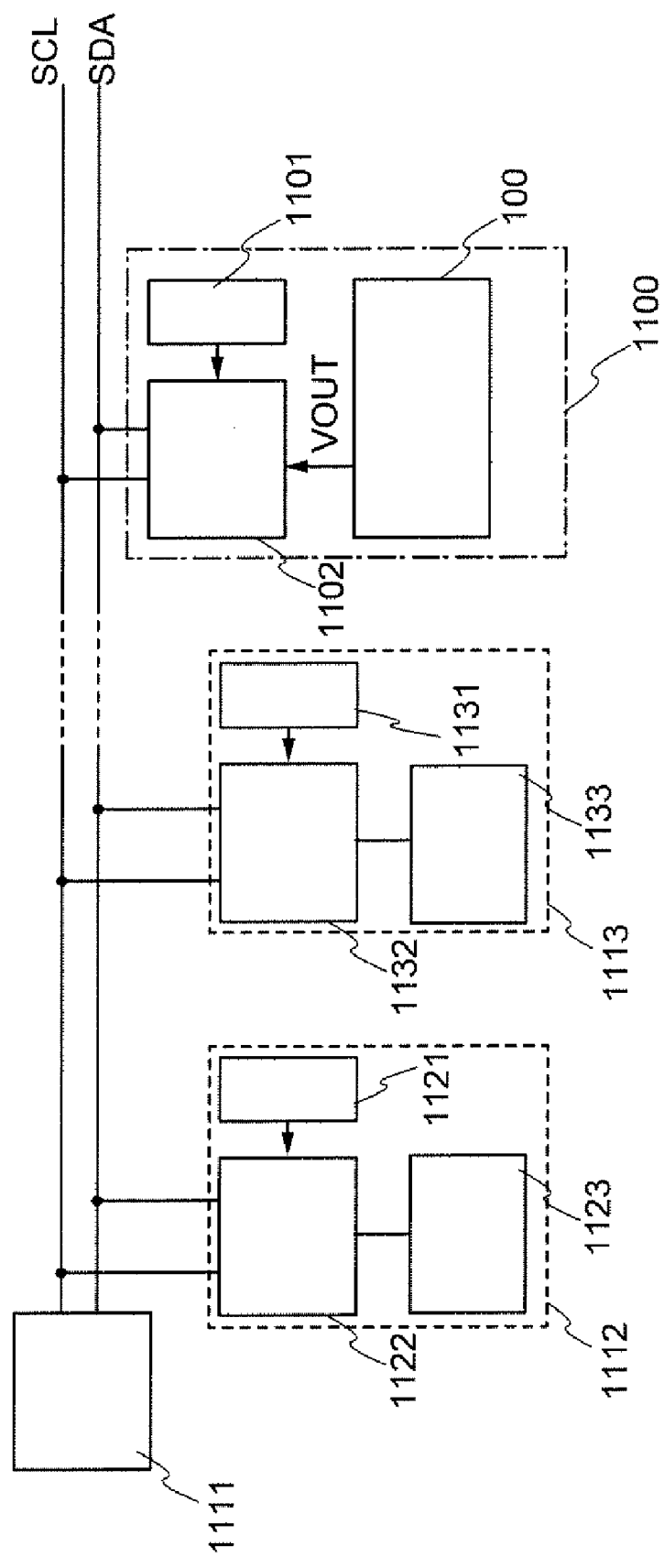
FIG. 11 is a block diagram for illustrating Embodiment 2.

A digital output photo IC 1100 illustrated in FIG. 11 includes the photoelectric conversion device 100 illustrated in FIG. 1, an address memory 1101, and an I2C (inter integrated circuit) interface circuit 1102. Further, the I2C interface circuit 1102 is electrically connected to an external device by an I2C bus which includes a serial data line (SDA) for data communication with a different device and a serial clock line (SCL) for controlling and synchronizing the data communication with the different device. The I2C bus which includes the SDA and the SCL is a bus standard for controlling a microcomputer 1111 with a specific address assigned to an address memory provided in each device. Note that in the case where the different device is a liquid crystal display device, for example, a structure is used in which a display driver 1112 which includes an address memory 1121, an I2C interface circuit 1122, and a logic portion 1123, and an LED driver 1113 which includes an address memory 1131, an I2C interface circuit 1132, and a logic portion 1133 are electrically connected to the I2C bus. In the case where the different device is a display device including an EL element, the LED driver for controlling LEDs which are used for a backlight is not necessarily provided.

Note that a digital signal which is converted in the photoelectric conversion device 100 is transmitted to a different external device such as the LED driver 1113 through the I2C interface circuit 1102. The LED driver 1113 generates a signal for controlling the LEDs which are used for the backlight of the display device in accordance with a digital signal related to illuminance obtained in the photo IC 1100 and outputs the signal.

Figure 12:
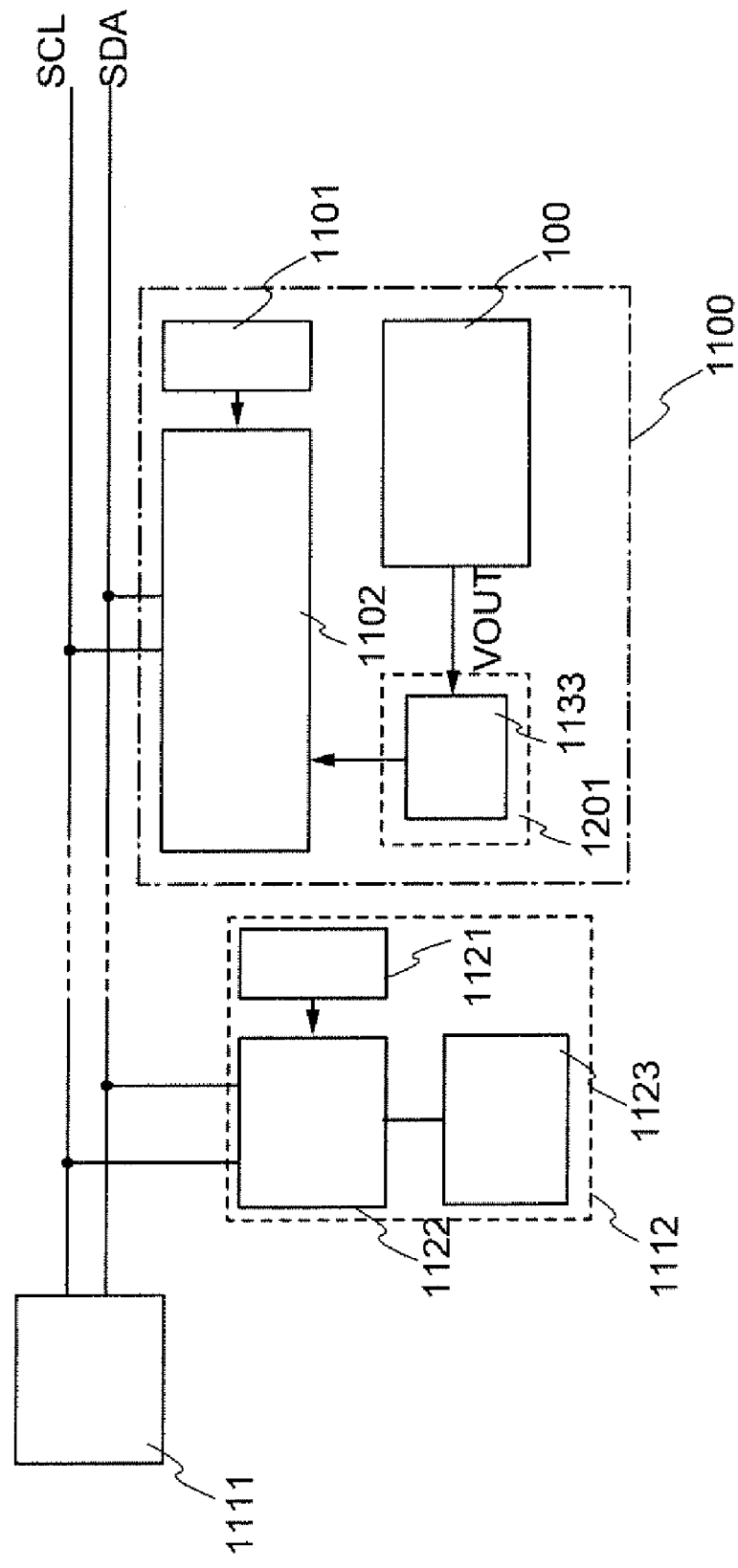
FIG. 12 is a block diagram for illustrating Embodiment 2.

In addition, a different structure of the digital output photo IC 1100 illustrated in FIG. 11 is illustrated in FIG. 12. In addition to the photoelectric conversion device 100, the photo IC 1100 illustrated in FIG. 12 includes the address memory 1101, the I2C interface circuit 1102, and an LED driver 1201. Further, the I2C interface circuit 1102 is electrically connected to the display driver 1112 by the I2C bus which includes the SDA and the SCL. The structure illustrated in FIG. 12 differs from the structure illustrated in FIG. 11 in that the LED driver 1201 including the logic portion 1133 is provided inside the photo IC 1100. By using the structure where the LED driver 1201 is provided inside the photo IC 1100, a digital signal which is generated in the photoelectric conversion device 100 can be directly received by the LED driver 1201 and can be output from the I2C interface circuit 1102. Thus, the circuits can be shared, so that reduction in size and increase in added value can be achieved.

Note that in FIG. 11 and FIG. 12, as the interface of each circuit, an I2C interface, which is one of digital serial interfaces, is used, for example. Instead of the I2C bus, a bus standard such as a universal serial bus or a serial peripheral interface can be used.

Note that the contents described in each drawing in this embodiment can be freely combined with or replaced with the contents described in any of the other embodiments as appropriate.

Embodiment 3

In this embodiment, a method for manufacturing a photoelectric conversion device according to an embodiment of the present invention is described with reference to FIGS. 13A to 13D and FIG. 14. Note that in this embodiment, an example of a photoelectric conversion including a thin film transistor (TFT) which is an element included in each circuit of the photoelectric conversion device and a longitudinal-junction PIN photodiode (hereinafter also referred to as a photodiode) which is a photoelectric conversion element is illustrated. Note that in the photoelectric conversion device according to an embodiment of the present invention, as well as the TFT and the PIN photodiode, a memory element, a resistor, a diode, a capacitor, an inductor, or the like is used in some cases. Alternatively, in the photoelectric conversion device according to an embodiment of the present invention, instead of the longitudinal-junction PIN photodiode, a lateral-junction PN photodiode nay be used.

First, a photodiode and a thin film transistor are formed over a light-transmitting substrate 1301. Here, for example, a glass substrate such as a barium borosilicate glass substrate or an aluminoborosilicate glass substrate, a quartz substrate, or the like can be used as the substrate 1301. By using the thin film transistor as a transistor formed over the substrate, the photodiode and the thin film transistor can be formed over the substrate in the same step. Therefore, there is an advantage that photoelectric conversion devices can be easily mass-produced.

Next, a silicon nitride oxide film which serves as a base insulating film 1302 (140-nm-thick) and a silicon oxynitride film (100-nm-thick) are sequentially stacked by plasma-enhanced CVD, and a semiconductor film such as an amorphous silicon film containing hydrogen (50-nm-thick) is stacked thereover without being exposed to the atmosphere. Note that the silicon nitride oxide film serves as a blocking layer which prevents an impurity such as an alkali metal from diffusing from a glass substrate.

Note that a silicon oxynitride film refers to a film which contains much oxygen than nitrogen, and in the case where measurement is performed using Rutherford backscattering spectrometry (RBS) and hydrogen forward scattering (HFS), contains oxygen, nitrogen, silicon, and hydrogen at concentrations ranging from 50 to 70 atomic percent, 0.5 to 15 atomic percent, 25 to 35 atomic percent, and 0.1 to 10 atomic percent, respectively Further, a silicon nitride oxide film refers to a film which contains much nitrogen than oxygen and contains oxygen, nitrogen, silicon, and hydrogen at concentrations ranging from 5 to 30 atomic percent, 20 to 55 atomic percent, 25 to 35 atomic percent, and 10 to 25 atomic percent, respectively. Note that percentages of nitrogen, oxygen, silicon, and hydrogen fall within the ranges given above if the total number of atoms contained in silicon oxynitride or silicon nitride oxide is defined as 100 atomic percent.

Next, the amorphous silicon film is crystallized by a known technique (e.g., a solid-phase epitaxy method, a laser crystallization method, or a crystallization method using catalytic metal) so that a semiconductor film having a crystalline structure (a crystalline semiconductor film), e.g., a polycrystalline silicon film is formed.

Next, a resist mask is formed over the semiconductor film having a crystalline structure (e.g., a crystalline silicon film) by using a first photomask and is used for etching the semiconductor film so that it has a desired shape. Thus, a semiconductor film which is processed into an island shape (in this specification, referred to as an island-shaped semiconductor region 1303) is formed. After the island-shaped semiconductor region is formed, the resist mask is removed.

Next, if necessary, a slight amount of an impurity element (e.g., boron or phosphorus) is added in order to control the threshold voltage of the TFT. Here, an ion doping method by which diborane ($B_2H_6$) is not mass-separated but excited by plasma is used.

Next, an insulating film which contains silicon as its main component and serves as a gate insulating film 1304 is formed. Here, a silicon oxynitride film is formed to a thickness of 30 nm by plasma-enhanced CVD.

Next, after a conductive film is formed over the gate insulating film 1304, a gate electrode 1305 is formed using a second photomask (see FIG. 13A). As the conductive film, a film where 30-nm-thick tantalum and 170-nm-thick tungsten (W) are stacked is used, for example.

For the gate electrode 1305, as well as the above film, a single-layer film formed using an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), or copper (Cu), or an alloy material or a compound material containing the above element as its main component; or a single-layer film formed using nitride of the above element, e.g., titanium nitride, tungsten nitride, tantalum nitride, or molybdenum nitride can be used.

Next, a source region or a drain region of the TFT is formed by introducing an impurity which imparts one conductivity type into the island-shaped semiconductor region 1303. Since an n-channel TFT is formed as an example in this embodiment, an to impurity which imparts n-type conductivity, such as phosphorus (P) or arsenic (As), is introduced into the island-shaped semiconductor region 1303. In the case where a p-channel TFT is formed, an impurity which imparts p-type conductivity is introduced into the island-shaped semiconductor region 1303.

Next, as a first interlayer insulating film, a silicon oxynitride film (50-nm-thick (not illustrated)), a silicon nitride oxide film 1306 (165-nm-thick), and a silicon oxynitride film 1307 (600-nm-thick) are formed.

Next, heat treatment (heat treatment at 300 to 550° C. for 1 to 12 hours, for example, at 410° C. for 1 hour in a nitrogen atmosphere) is performed so that the island-shaped semiconductor film is hydrogenated. This step is performed in order to terminate dangling bonds in the island-shaped semiconductor film with hydrogen contained in the silicon oxynitride film.

Next, a resist mask is formed using a third photomask, and the first interlayer insulating film and the gate insulating film 1304 are selectively etched so that contact holes are formed. Then, the resist mask is removed.

Next, after a conductive stacked film is formed by sputtering, a resist mask is formed using a fourth photomask, and the conductive stacked film is selectively etched so that a first wiring 1308 is formed (see FIG. 13B). Then, the resist mask is removed. Note that the conductive film in this embodiment has a three-layer structure where a 100-nm-thick Ti film, a 100-nm-thick Al film, and a 50-nm-thick Ti film are stacked.

Through the above steps, a top-gate TFT 1309 formed using a polycrystalline silicon film can be formed.

Next, an organic resin 1310 (1.5-μm-thick) is formed over the first interlayer insulating film and the first wiring 1308 as a second interlayer insulating film. Polyimide is used for the organic resin 1310. Alternatively, the organic resin 1310 may be formed using an organic material having heat resistance, such as acrylic, benzocyclobutene, polyamide, or epoxy. A resist mask is formed over the organic resin 1310 by using a fifth photomask, and the organic resin 1310 is selectively etched. Then, the resist mask is removed.

Next, over the organic resin 1310, a silicon nitride film 1311 (100-nm-thick) and a silicon oxide film 1312 (200-nm-thick) are sequentially formed. A resist mask is formed using a sixth photomask, and the silicon nitride film 1311 and the silicon oxide film 1312 are selectively etched. Then, the resist mask is removed. The silicon oxide film 1312 can be formed using a mixed gas of silane and oxygen, tetraethoxysilane (TEOS) and oxygen, or the like by a method such as thermal CVD, plasma-enhanced CVD, atmospheric pressure CVD, or bias ECRCVD. Further, typically, the silicon nitride film 1311 can be formed using a mixed gas of silane and ammonia by plasma-enhanced CVD.

Next, after a conductive film formed using a Ti film is formed over the second interlayer insulating film and the first wiring 1308, a resist mask is formed using a seventh photomask, and the conductive film is selectively etched so that a second wiring 1313 is formed. Note that the second wiring 1313 is etched using a halftone exposure technique or the like so that end portions of the second wiring 1313 are tapered.

Figure 13C:
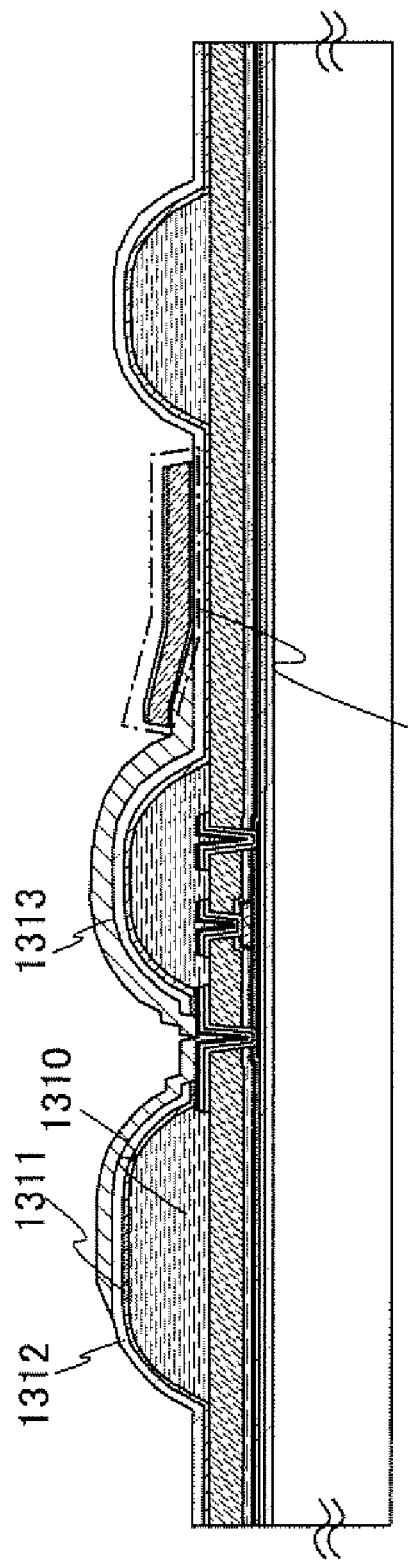

Next, a photoelectric conversion element 1314 formed using a photodiode is formed over the second interlayer insulating film and the second wiring 1313 (see FIG. 13C). Here, the photoelectric conversion element 1314 is formed using an amorphous silicon film having a three-layer structure of a layer which has p-type conductivity (60-nm-thick), a layer which has i-type (intrinsic) conductivity (400-nm-thick), and a layer which has n-type conductivity (80-nm-thick). The amorphous silicon film having a three-layer structure is formed as the photoelectric conversion element 1314. A resist mask is formed using an eighth mask, and the amorphous silicon film having a three-layer structure is selectively etched. Then, the resist mask is removed.

Figure 13D:
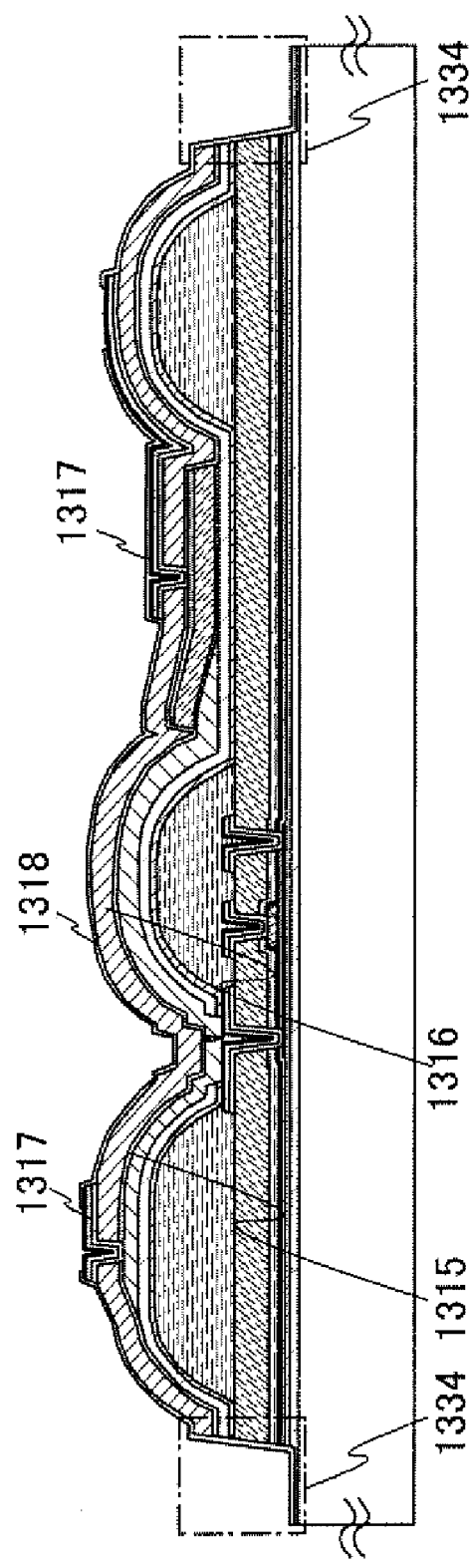
Figure 14:
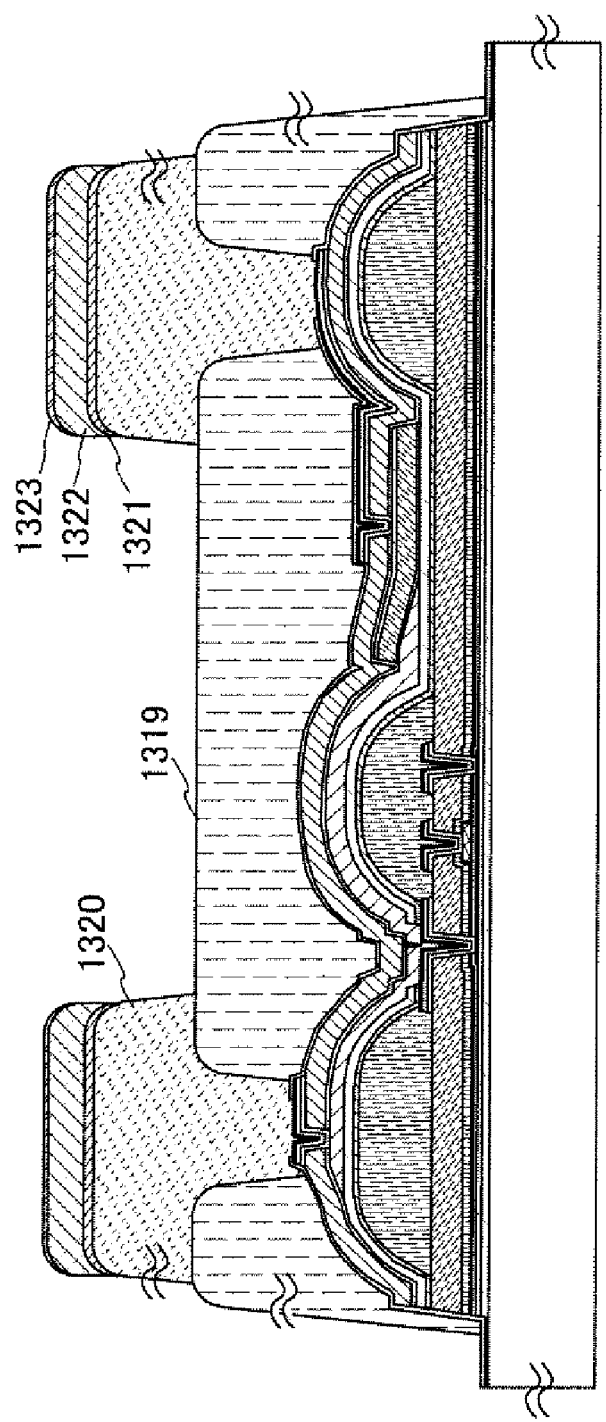
FIG. 14 is a cross-sectional view for illustrating Embodiment 3.

Note that over the one substrate 1301, a plurality of photoelectric conversion devices are formed simultaneously through the same steps. Therefore, it is necessary to cut the substrate 1301 into seprate sections in accordance with the size of the plurality of photoelectric conversion devices. In order to prevent an impurity from entering side surfaces of the divided photoelectric conversion device, the stacked film formed over the silicon nitride oxide film serving as the base insulating film 1302, which is provided in regions 1334 (portions expressed by dashed-dotted lines) which serves as the side surfaces of the photoelectric conversion device, is removed, as illustrated in FIG. 13D. This step is performed by forming a resist mask by using a ninth mask and performing selective etching. Then, the resist mask is removed.

Next, over the silicon nitride oxide film serving as the base insulating film 1302, the silicon oxide film 1312 serving as the second interlayer insulating film, the second wiring 1313, and the photoelectric conversion element 1314, a silicon nitride film 1315 (100-nm-thick) and a silicon oxide film 1316 (400-nm-thick) are sequentially formed as a third interlayer insulating film. A resist mask is formed using a tenth photomask, and the silicon nitride film 1315 and the silicon oxide film 1316 are selectively etched. Then, the resist mask is removed.

Next, after a conductive stacked film is formed over the third interlayer insulating film, the second wiring 1313, and the photoelectric conversion element 1314, a resist mask is formed using an eleventh photomask, and the conductive stacked film is selectively etched so that third wirings 1317 are formed. Note that the conductive film in this embodiment has a three-layer structure where a 50-nm-thick Ti film, a 100-nm-thick Al film, and a 50-nm-thick Ti film are stacked.

Next, over the silicon oxide film 1316 serving as the third interlayer insulating film and the third wirings 1317 and in the regions 1334 which are the side surfaces of the photoelectric conversion device, a silicon nitride film 1318 (100-nm-thick) is formed (see FIG. 13D). A resist mask is formed using a twelfth photomask, and the silicon nitride film 1318 is selectively etched. Then, the resist mask is removed.

Next, an insulating resin film 1319 (25-μm-thick) is formed. With the insulating resin film 1319, a top surface and side surfaces of a layer including the TFT 1309 are sealed. The insulating resin film 1319 is formed using a photosensitive epoxy-phenol-based resin film by a printing method. Note that opening portions for inputting and outputting signals from the photoelectric conversion device are provided in the insulating resin film 1319.

Next, a terminal electrode of the photoelectric conversion device is formed over the insulating resin film 1319. First, a first conductive film 1320 is formed to a thickness of approximately 15 μm by using a conductive paste containing nickel particles by a screen printing method.

A conductive paste refers to a material in which conductive particles or conductive powder is dispersed into a binder formed using a resin. By solidifying such a conductive paste, a conductive resin film is formed. Thus, since the first conductive film 1320 is formed using a conductive resin film, adhesion thereof to a solder is weak. Therefore, in order to improve the adhesion of the terminal electrode to a solder, a conductive film having a predetermined shape is formed on a top surface of the first conductive film 1320 by sputtering using a metal mask. For example, over the first conductive film 1320, a titanium film 1321 (150-nm-thick), a nickel film 1322 (750-nm-thick), and a gold (Au) film 1323 (50-nm-thick) are sequentially stacked (see FIG. 14).

Note that as for the photoelectric conversion device, the substrate 1301 is cut into separate photoelectric conversion devices. The substrate 1301 can be cut by dicing, laser cutting, or the like.

Through the above steps, the photoelectric conversion device can be manufactured.

Note that the contents described in each drawing in this embodiment can be freely combined with or replaced with the contents described in any of the other embodiments as appropriate.

Embodiment 4

In a photoelectric conversion device according to an embodiment of the present invention, a signal having a ramp wave with frequency corresponding to illuminance can be output as a digital signal without being adversely affected by circuit delay due to parasitic capacitance or the like. Thus, in an electronic device having the photoelectric conversion device according to an embodiment of the present invention, illuminance can be detected in the electronic device with high accuracy and improvement in visibility and reduction in power consumption can be achieved because the electronic device has the photoelectric conversion device as its component. The photoelectric conversion device according to an embodiment of the present invention can be used for display devices, laptops, or image reproducing devices provided with recording media (typically devices which reproduce the content of recording media such as DVDs (digital versatile disc) and have displays for displaying the reproduced images). Further, as electronic devices which can include the photoelectric conversion device according to an embodiment of the present invention, there are mobile phones, portable game machines, e-book readers, cameras such as video cameras or digital still cameras, goggle-type displays (head mounted displays), navigation systems, and audio reproducing devices (e.g., car audio equipment or audio component sets). Specific examples of such electronic devices are illustrated in FIGS. 15A and 15B.

Figure 15A:
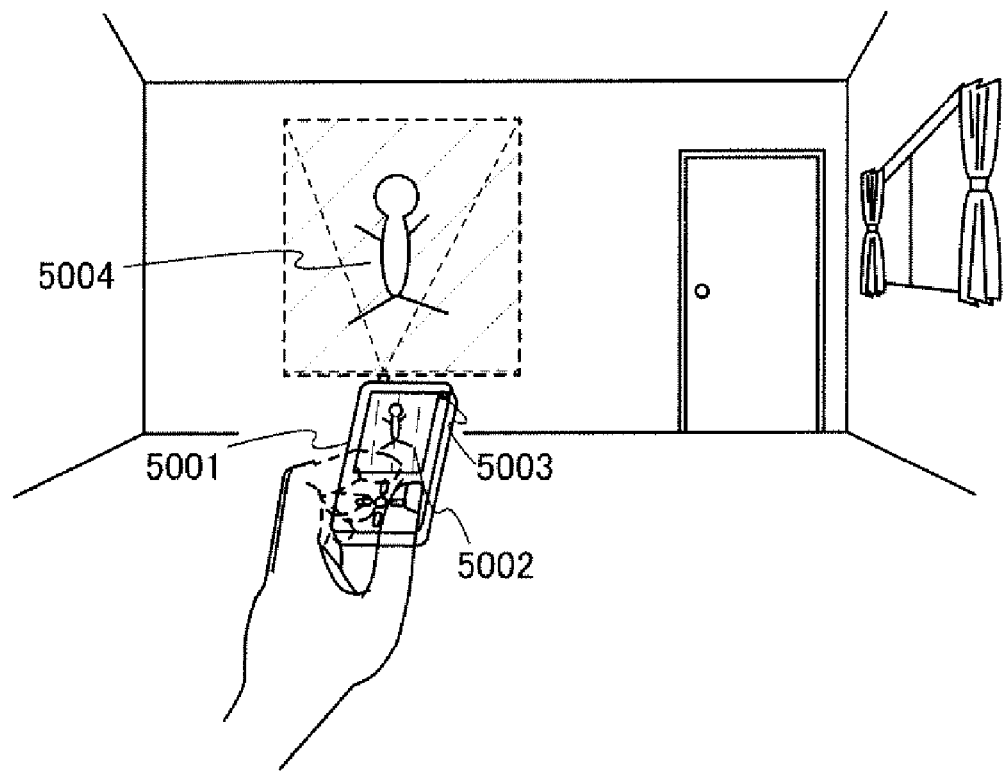
FIGS. 15A and 15B are diagrams for illustrating Embodiment 4.
Figure 15B:
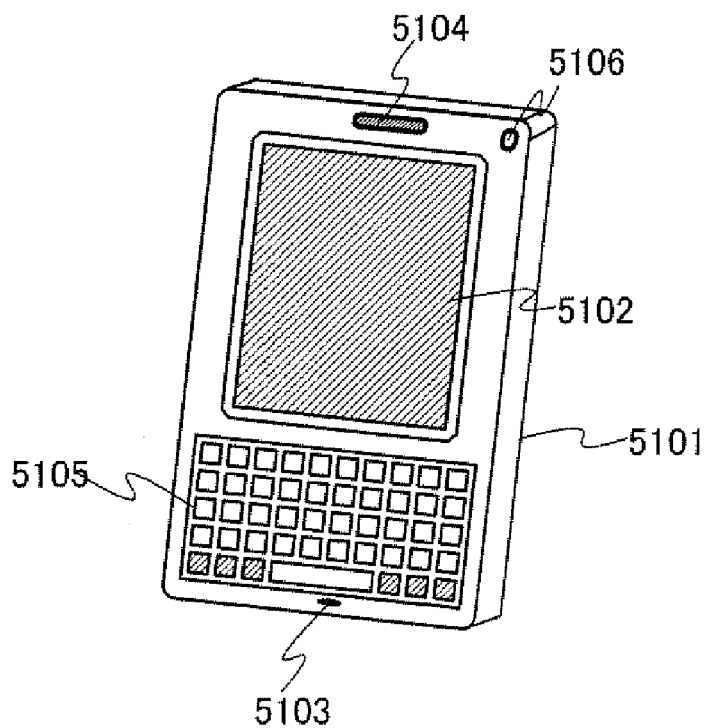

FIG. 15A illustrates a display device, which includes a housing 5001, a display portion 5002, a sensor portion 5003, and the like. The photoelectric conversion device according to an embodiment of the present invention can be used for the sensor portion 5003. The sensor portion 5003 detects the illuminance of external light. The display device can control the luminance of the display portion 5002 in accordance with the detected illuminance. By controlling the luminance of the display portion 5002 in accordance with the illuminance, power consumption of the display device can be reduced.

Note that the display device in FIG. 15A can also project an image 5004 on a wall or the like by a MEMS technique or the like. The luminance of the image 5004 can also be controlled by the sensor portion 5003, so that power consumption of the display device can be reduced. Note that the display device includes all display devices for displaying information, such as display devices for personal computers, for receiving TV broadcast, and for displaying advertisements, in its category FIG. 15B illustrates a mobile phone, which includes a main body 5101, a display portion 5102, an audio input portion 5103, an audio output portion 5104, operation keys 5105, a sensor portion 5106, and the like. The sensor portion 5106 detects the intensity of external light. The mobile phone can control the luminance of the display portion 5102 or the operation keys 5105 in accordance with the detected illuminance. By controlling the luminance of the display portion 5102 or the operation keys 5105 in accordance with the illuminance, power consumption of the mobile phone can be reduced.

Note that the contents described in each drawing in this embodiment can be freely combined with or replaced with the contents described in any of the other embodiments as appropriate.

This application is based on Japanese Patent Application serial no. 2008-204965 filed with Japan Patent Office on Aug. 8, 2008, the entire contents of which are hereby incorporated by reference.

The invention claimed is:

1. A photoelectric conversion device comprising:
a photoelectric conversion element capable of generating a photocurrent;
a ramp-wave output circuit configured to output a ramp-wave signal having frequency corresponding to an amount of the photocurrent;
a first comparator configured to compare the ramp-wave signal and a first potential;
a second comparator configured to compare the ramp-wave signal and a second potential;
a flip-flop circuit configured to receive a first output signal of the first comparator and a second output signal of the second comparator and generate a clock signal having a frequency depending upon the amount of the photocurrent,
a NOR circuit configured to receive the first output signal of the first comparator and the second output signal of the second comparator;
a counter circuit configured to count a pulse number of the clock signal; and
a pulse output circuit including a switch, the pulse output circuit being configured to generate a period during which the pulse number is counted in the counter circuit,
wherein the switch is configured to stop generation of the period during which the pulse number is counted in accordance with an output signal of the NOR circuit.

2. The photoelectric conversion device according to claim 1,
wherein the pulse output circuit includes an oscillator circuit and a counter circuit, and
wherein the switch is configured to output a pulse by intermittent input of a clock signal output from the oscillator circuit to the counter circuit.

3. A photoelectric conversion device comprising:
a photoelectric conversion element capable of generating a photocurrent;
a plurality of amplifier circuits electrically connected to the photoelectric conversion element;
a ramp-wave output circuit configured to output a ramp-wave signal having frequency corresponding to an amount of the photocurrent;
a switching circuit configured to selectively connect one of the plurality of amplifier circuits to the ramp-wave output circuit;
a first comparator configured to compare the ramp-wave signal and a first potential;
a second comparator configured to compare the ramp-wave signal and a second potential;
a flip-flop circuit configured to receive a first output signal of the first comparator and a second output signal of the second comparator and generate a clock signal having a frequency depending upon the amount of the photocurrent;
a NOR circuit configured to receive the first output signal of the first comparator and the second output signal of the second comparator;
a counter circuit configured to count a pulse number of the clock signal;
a pulse output circuit including a switch, the pulse output circuit being configured to generate a period during which the pulse number is counted in the counter circuit; and
wherein the switch is configured to stop generation of the period during which the pulse number is counted in accordance with an output signal of the NOR circuit.

4. The photoelectric conversion device according to claim 3,
wherein each of the plurality of amplifier circuits is a current mirror circuit.

5. The photoelectric conversion device according to claim 4,
wherein the pulse output circuit includes an oscillator circuit and a counter circuit, and
wherein the switch is configured to output a pulse by intermittent input of a clock signal output from the oscillator circuit to the counter circuit.

6. The photoelectric conversion device according to claim 3,
wherein the pulse output circuit includes an oscillator circuit and a counter circuit, and
wherein the switch is configured to output a pulse by intermittent input of a clock signal output from the oscillator circuit to the counter circuit.

7. A photoelectric conversion device comprising:
a photoelectric conversion element capable of generating a photocurrent;
a plurality of amplifier circuits electrically connected to the photoelectric conversion element;
a ramp-wave output circuit configured to output a ramp-wave signal having frequency corresponding to an amount of the photocurrent;
a switching circuit configured to selectively connect one of the plurality of amplifier circuits to the ramp-wave output circuit;
a first comparator configured to compare the ramp-wave signal and a first potential;
a second comparator configured to compare the ramp-wave signal and a second potential;
a flip-flop circuit configured to receive a first output signal of the first comparator and a second output signal of the second comparator and generate a clock signal having a frequency depending upon the amount of the photocurrent;

a NOR circuit configured to receive the first output signal of the first comparator and the second output signal of the second comparator;

a counter circuit configured to count a pulse number of the clock signal; and a pulse output circuit including a switch, the pulse output circuit being configured to generate a period during which the pulse number is counted in the counter circuit; and wherein the switch is configured to stop generation of the period during which the pulse number is counted in accordance with an output signal of the NOR circuit, and wherein the plurality of amplifier circuits have different amplification factors.

8. The photoelectric conversion device according to claim 7,
wherein each of the plurality of amplifier circuits is a current mirror circuit.

9. The photoelectric conversion device according to claim 8,
wherein the pulse output circuit includes an oscillator circuit and a counter circuit, and
wherein the switch is configured to output a pulse by intermittent input of a clock signal output from the oscillator circuit to the counter circuit.

10. The photoelectric conversion device according to claim 7,
wherein the pulse output circuit includes an oscillator circuit and a counter circuit, and
wherein the switch is configured to output a pulse by intermittent input of a clock signal output from the oscillator circuit to the counter circuit.

11. An electronic device comprising the photoelectric conversion device according to claim 1.

12. An electronic device comprising the photoelectric conversion device according to claim 3.

13. An electronic device comprising the photoelectric conversion device according to claim 7.

14. A mobile phone comprising:
a display device; and
a photoelectric conversion device operationally connected to the display device, the photoelectric conversion device comprising:
a photoelectric conversion element capable of generating a photocurrent;
a ramp-wave output circuit configured to output a ramp-wave signal having frequency corresponding to an amount of the photocurrent;
a first comparator configured to compare the ramp-wave signal and a first potential;
a second comparator configured to compare the ramp-wave signal and a second potential;
a flip-flop circuit configured to receive a first output signal of the first comparator and a second output signal of the second comparator and generate a clock signal having a frequency depending upon the amount of the photocurrent;
a NOR circuit configured to receive the first output signal of the first comparator and the second output signal of the second comparator;
a counter circuit configured to count a pulse number of the clock signal; and
a pulse output circuit including a switch, the pulse output circuit being configured to generate a period during which the pulse number is counted in the counter circuit,
wherein the switch is configured to stop generation of the period during which the pulse number is counted in accordance with an output signal of the NOR circuit.

15. The mobile phone according to claim 14,
wherein the pulse output circuit includes an oscillator circuit and a counter circuit, and
wherein the switch is configured to output a pulse by intermittent input of a clock signal output from the oscillator circuit to the counter circuit.

16. A mobile phone comprising:
a display device; and
a photoelectric conversion device operationally connected to the display device, the photoelectric conversion device comprising:
a photoelectric conversion element capable of generating a photocurrent;
a plurality of amplifier circuits electrically connected to the photoelectric conversion element;
a ramp-wave output circuit configured to output a ramp-wave signal having frequency corresponding to an amount of the photocurrent;
a switching circuit configured to selectively connect one of the plurality of amplifier circuits to the ramp-wave output circuit;
a first comparator configured to compare the ramp-wave signal and a first potential;
a second comparator configured to compare the ramp-wave signal and a second potential;
a flip-flop circuit configured to receive a first output signal of the first comparator and a second output signal of the second comparator and generate a clock signal having a frequency depending upon the amount of the photocurrent;
a NOR circuit configured to receive the first output signal of the first comparator and the second output signal of the second comparator;
a counter circuit configured to count a pulse number of the clock signal;
a pulse output circuit including a switch, the pulse output circuit being configured to generate a period during which the pulse number is counted in the counter circuit; and
wherein the switch is configured to stop generation of the period during which the pulse number is counted in accordance with an output signal of the NOR circuit.

17. The mobile phone according to claim 16,
wherein each of the plurality of amplifier circuits is a current mirror circuit.

18. The mobile phone according to claim 16,
wherein the pulse output circuit includes an oscillator circuit and a counter circuit, and
wherein the switch is configured to output a pulse by intermittent input of a clock signal output from the oscillator circuit to the counter circuit.

* * * * *